(12) United States Patent
Ngo et al.

(10) Patent No.: US 8,130,574 B2
(45) Date of Patent: Mar. 6, 2012

(54) ERROR DETECTION ON PROGRAMMABLE LOGIC RESOURCES

(75) Inventors: Ninh D. Ngo, San Jose, CA (US); Andy L. Lee, San Jose, CA (US); Kerry Veenstra, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/024,666

(22) Filed: Feb. 10, 2011

(65) Prior Publication Data

US 2011/0138240 A1 Jun. 9, 2011

Related U.S. Application Data

(60) Continuation of application No. 12/503,637, filed on Jul. 15, 2009, now Pat. No. 7,907,460, which is a division of application No. 11/930,739, filed on Oct. 31, 2007, now Pat. No. 7,577,055, which is a division of application No. 10/270,711, filed on Oct. 10, 2002, now Pat. No. 7,310,757.

(60) Provisional application No. 60/328,668, filed on Oct. 11, 2001.

(51) Int. Cl.
*G11C 29/00* (2006.01)

(52) U.S. Cl. ............... 365/201; 365/189.07; 714/725; 714/766

(58) Field of Classification Search .............. 365/201, 365/189.07; 714/725, 766
See application file for complete search history.

(56) References Cited

U.S. PATENT DOCUMENTS

| | | | |
|---|---|---|---|
| 4,005,405 A | 1/1977 | West | |
| 4,375,664 A | 3/1983 | Kim | |
| 4,866,717 A | 9/1989 | Murai et al. | |
| 4,918,378 A * | 4/1990 | Katircioglu et al. | .......... 365/201 |
| 4,930,098 A | 5/1990 | Allen | |
| 4,930,107 A | 5/1990 | Chan et al. | |
| 4,940,909 A | 7/1990 | Mulder et al. | |
| 5,111,464 A | 5/1992 | Farmwald et al. | |
| 5,200,920 A | 4/1993 | Norman et al. | |

(Continued)

FOREIGN PATENT DOCUMENTS

EP 0 291 167 11/1988

(Continued)

OTHER PUBLICATIONS

Ahrens et al., "Predictive Maintenance for Prevention of Uncorrectable Multiple BIT Errors in Memory," IP.com, Prior Art Database, Jan. 28, 2005, pp. 1-5 (originally published: IBM TDB, Aug. 1, 1989, pp. 239-244).

(Continued)

*Primary Examiner* — Viet Q Nguyen
(74) *Attorney, Agent, or Firm* — Ropes & Gray LLP

(57) ABSTRACT

Error detection circuitry is provided on a programmable logic resource. Programmable logic resource configuration data is loaded into a cyclic redundancy check (CRC) module where a checksum calculation may be performed. In one embodiment, the checksum may be compared to an expected value, which is a precomputed checksum on data prior to being programmed into or while data is being programmed into a programmable logic resource. In another embodiment, the expected value may be included in the checksum calculation. An output indicating whether an error is detected may be generated depending on the relationship between the checksum and the expected value, or on the value of the checksum. This output may be sent to an output pin that is accessible by user logic.

20 Claims, 17 Drawing Sheets

U.S. PATENT DOCUMENTS

| | | |
|---|---|---|
| 5,237,219 A | 8/1993 | Cliff |
| 5,291,079 A | 3/1994 | Goetting |
| 5,305,324 A | 4/1994 | Demos |
| 5,307,056 A | 4/1994 | Urbanus |
| 5,321,704 A | 6/1994 | Erickson et al. |
| 5,349,691 A | 9/1994 | Harrison et al. |
| 5,426,379 A | 6/1995 | Trimberger |
| 5,430,687 A | 7/1995 | Hung et al. |
| 5,466,117 A | 11/1995 | Resler et al. |
| 5,495,491 A | 2/1996 | Snowden et al. |
| 5,511,211 A | 4/1996 | Akao et al. |
| 5,528,176 A | 6/1996 | Kean |
| 5,543,730 A | 8/1996 | Cliff et al. |
| 5,552,722 A | 9/1996 | Kean |
| 5,581,198 A | 12/1996 | Trimberger |
| 5,588,112 A | 12/1996 | Dearth et al. |
| 5,590,305 A | 12/1996 | Terrill et al. |
| 5,598,424 A * | 1/1997 | Erickson et al. .............. 714/799 |
| 5,598,530 A | 1/1997 | Nagao |
| 5,606,276 A | 2/1997 | McClintock |
| 5,608,342 A | 3/1997 | Trimberger |
| 5,629,949 A | 5/1997 | Zook |
| 5,640,106 A | 6/1997 | Erickson et al. |
| 5,650,734 A | 7/1997 | Chu et al. |
| 5,670,897 A | 9/1997 | Kean |
| 5,680,061 A | 10/1997 | Veenstra et al. |
| 5,691,907 A | 11/1997 | Resler et al. |
| 5,694,056 A | 12/1997 | Mahoney et al. |
| 5,694,399 A | 12/1997 | Jacobson et al. |
| 5,696,454 A | 12/1997 | Trimberger |
| 5,742,531 A | 4/1998 | Freidin et al. |
| 5,754,566 A | 5/1998 | Christopherson et al. |
| 5,767,734 A | 6/1998 | Vest et al. |
| 5,773,993 A | 6/1998 | Trimberger |
| 5,798,656 A | 8/1998 | Kean |
| 5,812,472 A | 9/1998 | Lawrence et al. |
| 5,821,772 A | 10/1998 | Ong et al. |
| 5,838,167 A | 11/1998 | Erickson et al. |
| 5,841,867 A * | 11/1998 | Jacobson et al. .............. 713/187 |
| 5,844,829 A | 12/1998 | Freidin et al. |
| 5,844,854 A | 12/1998 | Lee |
| 5,848,026 A | 12/1998 | Ramamurthy et al. |
| 5,860,078 A | 1/1999 | Emmot |
| 5,869,980 A | 2/1999 | Chu et al. |
| 5,873,113 A | 2/1999 | Rezvani |
| 5,943,490 A | 8/1999 | Sample |
| 5,949,987 A | 9/1999 | Curd et al. |
| 5,961,576 A | 10/1999 | Freidin et al. |
| 5,978,952 A | 11/1999 | Hayek et al. |
| 5,995,744 A | 11/1999 | Guccione |
| 5,995,988 A | 11/1999 | Freidin et al. |
| 5,999,014 A | 12/1999 | Jacobson et al. |
| 6,011,406 A | 1/2000 | Veenstra |
| 6,018,250 A | 1/2000 | Chiang et al. |
| 6,023,565 A | 2/2000 | Lawman et al. |
| 6,024,486 A | 2/2000 | Olarig et al. |
| 6,028,445 A | 2/2000 | Lawman |
| 6,044,025 A | 3/2000 | Lawman |
| 6,049,222 A | 4/2000 | Lawman |
| 6,052,755 A | 4/2000 | Terrill et al. |
| 6,057,704 A | 5/2000 | New et al. |
| 6,065,146 A | 5/2000 | Bosshart |
| 6,069,489 A | 5/2000 | Iwanczuk et al. |
| 6,097,210 A | 8/2000 | Iwanczuk et al. |
| 6,101,614 A | 8/2000 | Gonzales et al. |
| 6,105,105 A | 8/2000 | Trimberger |
| 6,128,215 A | 10/2000 | Lee |
| 6,128,760 A | 10/2000 | Poeppleman et al. |
| 6,137,307 A | 10/2000 | Iwanczuk et al. |
| 6,154,048 A | 11/2000 | Iwanczuk et al. |
| 6,184,705 B1 | 2/2001 | Cliff et al. |
| 6,191,614 B1 | 2/2001 | Schultz et al. |
| 6,201,406 B1 | 3/2001 | Iwanczuk et al. |
| 6,204,687 B1 | 3/2001 | Schultz et al. |
| 6,216,259 B1 | 4/2001 | Guccione et al. |
| 6,223,309 B1 | 4/2001 | Dixon et al. |
| 6,237,124 B1 | 5/2001 | Plants |
| 6,242,941 B1 | 6/2001 | Vest et al. |
| 6,279,128 B1 | 8/2001 | Arnold et al. |
| 6,314,550 B1 | 11/2001 | Wang et al. |
| 6,349,390 B1 | 2/2002 | Dell et al. |
| 6,366,117 B1 | 4/2002 | Pang et al. |
| 6,429,682 B1 | 8/2002 | Schultz et al. |
| 6,429,871 B1 | 8/2002 | Katsura et al. |
| 6,441,641 B1 | 8/2002 | Pang et al. |
| 6,510,534 B1 * | 1/2003 | Nadeau-Dostie et al. ..... 714/724 |
| 6,545,501 B1 * | 4/2003 | Bailis et al. .................... 326/10 |
| 6,560,743 B2 | 5/2003 | Plants |
| 6,636,935 B1 | 10/2003 | Ware et al. |
| 6,651,155 B1 | 11/2003 | Bocchino et al. |
| 6,651,238 B1 * | 11/2003 | Wells et al. .................... 716/103 |
| 6,678,861 B1 * | 1/2004 | Jones et al. .................... 714/781 |
| 6,701,480 B1 | 3/2004 | Karpuszka et al. |
| 6,772,387 B1 * | 8/2004 | Plants ............................ 714/763 |
| 6,832,340 B2 | 12/2004 | Larson et al. |
| 6,838,899 B2 | 1/2005 | Plants |
| 6,839,868 B1 | 1/2005 | Pignol |
| 6,847,554 B2 | 1/2005 | Satori |
| 6,848,063 B2 | 1/2005 | Rodeheffer et al. |
| 6,859,904 B2 | 2/2005 | Kocol et al. |
| 6,861,867 B2 * | 3/2005 | West et al. ...................... 326/38 |
| 6,891,395 B2 * | 5/2005 | Wells et al. .................... 326/38 |
| 6,938,201 B2 * | 8/2005 | Goyins et al. ................. 714/805 |
| 6,944,836 B1 * | 9/2005 | Lai ................................. 716/136 |
| 6,981,153 B1 | 12/2005 | Pang et al. |
| 7,007,203 B2 | 2/2006 | Gorday et al. |
| 7,036,059 B1 | 4/2006 | Carmichael et al. |
| 7,075,827 B2 | 7/2006 | Aoyama et al. |
| 7,093,175 B2 * | 8/2006 | Rajski et al. ................... 714/728 |
| 7,103,743 B2 | 9/2006 | Goldschmidt |
| 7,170,891 B2 | 1/2007 | Messenger |
| 7,278,128 B1 | 10/2007 | Trimberger |
| 7,310,757 B2 | 12/2007 | Ngo et al. |
| 7,370,254 B2 | 5/2008 | Rajski et al. |
| 7,461,312 B2 * | 12/2008 | Tardif et al. .................... 714/732 |
| 7,577,055 B2 * | 8/2009 | Ngo et al. ................. 365/230.08 |
| 7,627,798 B2 * | 12/2009 | Kiryu ............................. 714/733 |
| 7,701,254 B2 * | 4/2010 | Chow et al. ...................... 326/93 |
| 7,907,460 B2 * | 3/2011 | Ngo et al. ...................... 365/201 |
| 2004/0230767 A1 | 11/2004 | Bland et al. |
| 2005/0040844 A1 | 2/2005 | Plants |
| 2005/0044467 A1 | 2/2005 | Leung et al. |
| 2005/0071730 A1 | 3/2005 | Moyer et al. |
| 2005/0073884 A1 | 4/2005 | Gonzalez et al. |
| 2005/0144551 A1 | 6/2005 | Nahas |
| 2005/0154943 A1 | 7/2005 | Alexander et al. |
| 2007/0234163 A1 | 10/2007 | Mukherjee et al. |

FOREIGN PATENT DOCUMENTS

| | | |
|---|---|---|
| EP | 0 838 969 | 4/1998 |
| EP | 1 100 020 | 5/2001 |
| JP | 61101857 | 5/1986 |
| JP | 62251949 | 11/1987 |
| JP | 1-134550 | 5/1989 |
| JP | 5-327477 | 12/1993 |
| JP | 06-036600 | 10/1994 |
| JP | 08-340342 | 12/1996 |
| JP | 10-27139 | 1/1998 |
| JP | 11-44741 | 2/1999 |
| WO | WO 98/29811 | 7/1998 |

OTHER PUBLICATIONS

"Antifuse FPGA shoots for the stars," EDN, vol. 48, No. 12, May 29, 2003, p. 20.

*Application Note: Virtex Series*, "Virtex FPGA Series Configuration and Readback," Xilinx, XAPP138 (v2.7), Jul. 11, 2002, pp. 1-39.

Bazes et al., "Programmable NMOS DRAM Controller for Microcomputer Systems with Dual-port Memory and Error Checking and Correction," IEEE Journal of Solid-State Circuits, vol. SC-18, No. 2, Apr. 1983, Abstract.

Huang et al., "A memory coherence technique for online transient error recovery of FPGA configurations," Proceedings of the 2001 ACM-SIGDA 9$^{th}$ International Symposium on Field Programmable Gate Arrays, Feb. 11-13, 2001, pp. 183-192.

Johnson, "Multibit error correction in a monolithic semiconductor memory," IP.com Prior Art Database, Sep. 8, 2003, pp. 1-10.

Mahmood et al., "Concurrent Error Detection Using Watchdog Processors—A Survey," IEEE Transactions on Computers, vol. 37, No. 2, Feb. 1998, Abstract.

Matsumoto, "Million-gate architecture will vie with ASIC-like approach from Altera, Lucent and GateField—size matters, says Xilinx with Virtex launch," Electronic Engineering Times, Oct. 26, 1998.

Michinishi et al., "Testing for the programming circuit of SRAM-based FPGAs," IEICE Transactions on Information and Systems, vol. E82-D, No. 6, 1999, Abstract.

*The Programmable Logic Data Book 1999*, Xilinx, pp. 4-31 to 4-37, 6-49 to 6-57, and 7-104 to 7-113.

Tiwari et al., "Enhanced Reliability of Finite-State Machines in FPGA Through Efficient Fault Detection and Correction," IEEE Transactions on Reliability, vol. 54, No. 3, Sep. 2005, pp. 459-467.

"Tradeoffs abound in FPGA design: understanding device types and design flows is key to getting the most out of FPGAs," Electronic Design, vol. 51, No. 27, Dec. 4, 2003, p. S1.

Wang et al., "SRAM Based Re-programmable FPGA for Space Applications," IEEE Transactions on Nuclear Science, vol. 46, No. 6, Dec. 1999, pp. 1728-1735.

* cited by examiner

ERROR DETECTION ON PROGRAMMABLE LOGIC RESOURCES

CROSS REFERENCE TO RELATED APPLICATION

This application is a continuation of U.S. patent application Ser. No. 12/503,637, filed Jul. 15, 2009 now U.S. Pat. No. 7,907,460, which is a division of U.S. patent application Ser. No. 11/930,739, filed Oct. 31, 2007 (now U.S. Pat. No. 7,577,055), which is a division of U.S. patent application Ser. No. 10/270,711, filed Oct. 10, 2002 (now U.S. Pat. No. 7,310,757), which claims the benefit of U.S. provisional patent application No. 60/328,668, filed Oct. 11, 2001, each of which is hereby incorporated by reference herein in its entirety.

BACKGROUND OF THE INVENTION

This invention relates to programmable logic resources. More particularly, this invention relates to providing error detection on programmable logic resources.

A programmable logic resource is a general-purpose integrated circuit that is programmable to perform any of a wide range of logic tasks. Known examples of programmable logic resources include programmable logic devices (PLDs) and field-programmable gate arrays (FPGAs). Memory blocks are provided on programmable logic resources and can be used to store and subsequently output data, or to perform various functions desired by the user.

Data can be stored in memory blocks as programmable logic resource configuration data. When data is being programmed into the memory blocks or while the data is stored in the memory blocks, errors can occur in the representation of the programmable logic resource configuration data. Such errors can include hard errors and soft errors. Hard errors arise due to physical imperfections in a programmable logic resource or due to physical damage to a programmable logic resource. A soft error occurs when, during operation of a programmable logic resource, an alpha particle or cosmic ray strikes the silicon of the programmable logic resource, causing the formation of electron-hole pairs that alters the content of a memory cell. Programmable logic resources, because of their large number of small-capacitance memory nodes, are particularly susceptible to soft errors. A soft error directly affects the logic functionality of the programmable logic resource, thereby causing logic failure. Currently, there are no available methods for detecting such errors in programmable logic resources.

In view of the foregoing, it would be desirable to provide systems and methods for detecting errors in programmable logic resources.

SUMMARY OF THE INVENTION

It is therefore an object of the present invention to provide systems and methods for detecting errors in programmable logic resources.

In accordance with this invention, error detection circuitry is provided that detects errors in programmable logic resource configuration data. Prior to programming data into a memory on a programmable logic resource or while data is being programmed into a memory on a programmable logic resource, a checksum may be computed by dividing the data by a control expression and taking the remainder. This computation may be implemented in software or by the error detection circuitry. The control expression may be any suitable representation of data including a polynomial such as, for example, the 32-bit cyclic redundancy check (CRC-32) Institute of Electrical and Electronic Engineers (IEEE) 802 standard. This checksum, also referred to as an expected value, may be stored in any suitable location on the programmable logic resource (e.g., in a dedicated register) and is retrieved during error detection.

A flag such as a dedicated bit in a register, may be initialized by a user to signal the start of error detection. After the data has been programmed into the memory, the flag may be set and error detection may be initiated with a finite state machine directing the loading of programmable logic resource configuration data to error detection circuitry. As programmable logic resource configuration data is being loaded into the error detection circuitry of the programmable logic resource, the error detection circuitry begins computing a checksum with the loaded data using the same or equivalent control expression used to compute the expected value. When all the programmable logic resource configuration data has been loaded, the finite state machine directs the loading of the expected value to the error detection circuitry.

In one embodiment of the present invention, a checksum is computed on the programmable logic resource configuration data and this resulting checksum is compared to the expected value. No error is detected if the checksum and the expected value meet some predetermined relationship (e.g., the checksum and the expected value are equal, the checksum differs from the expected value by a predetermined offset or multiple).

In another embodiment of the present invention, the programmable logic resource configuration data is first loaded into an exclusive OR (XOR) tree. After the programmable logic resource configuration data is loaded, the expected value is then loaded into the XOR tree. The XOR tree computes a checksum on the loaded data and expected value based on the control expression. No error is detected if the checksum is equal to some predetermined value (e.g., the checksum is zero, the checksum is a predetermined offset). The output generated by the error detection circuitry is sent to an output pin on the programmable logic resource, which may be monitored by user logic.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION

Figure 1:
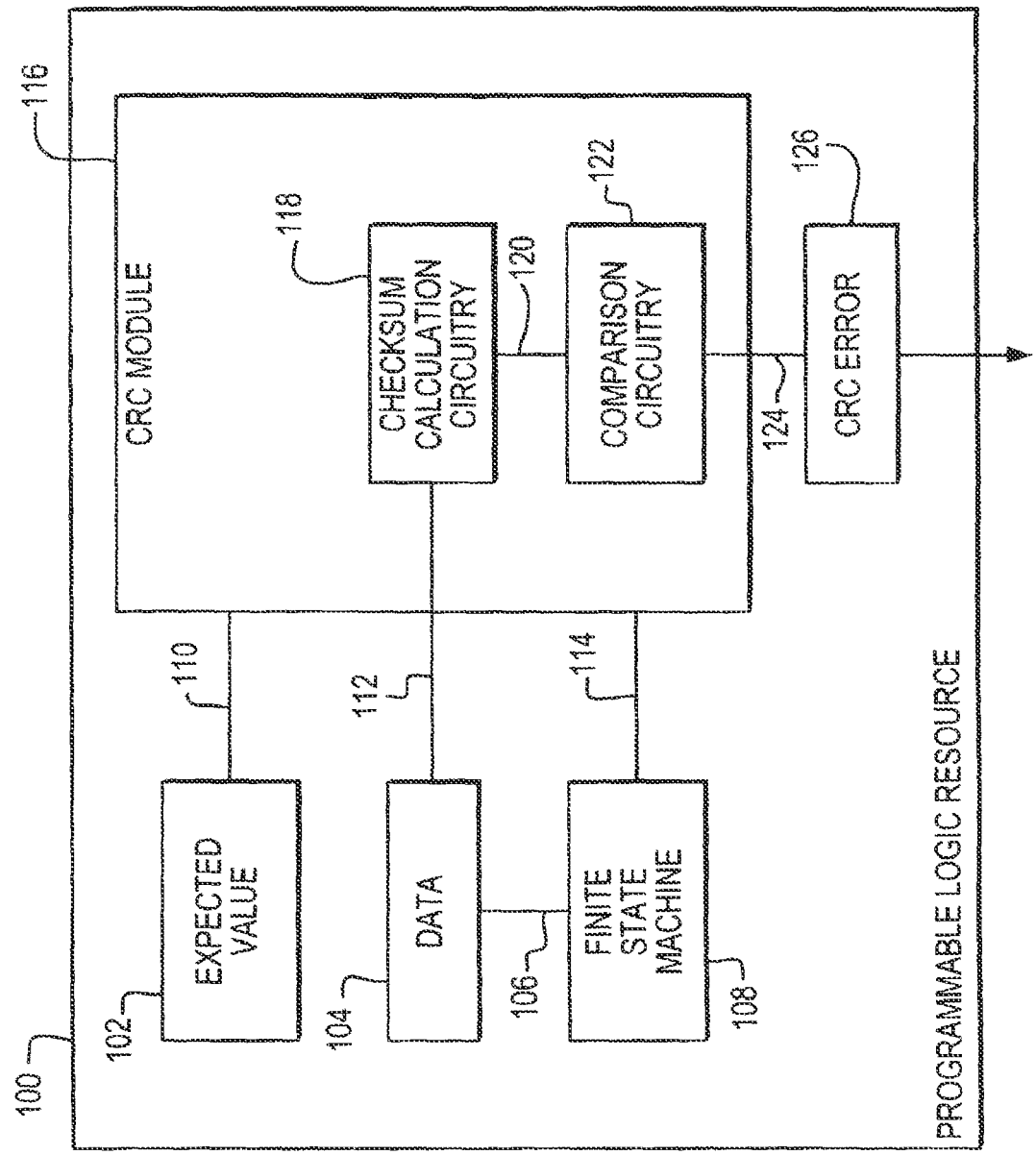
FIG. 1 is a block diagram of a programmable logic resource with error detection circuitry in accordance with one embodiment of the invention.

The present invention provides systems and methods for detecting errors in programmable logic resources. Programmable logic resources include, for example, programmable logic devices, field-programmable gate arrays, or any other suitable programmable device. Errors include soft errors, hard errors, or both. Errors may also be attributed to voltage spikes, system bugs, other external forces including line transmission faults and hardware failures, or any other event that affects the representation of data in the programmable logic resources.

A programmable logic resource holds data to program that programmable logic resource to implement any of one or more various applications. This data is referred to herein as programmable logic resource configuration data. The programmable logic resource configuration data is represented as a set of binary digits (i.e., binary "1's" and "0's") and may be stored in any suitable memory such as, for example, a configuration random access memory (CRAM). Alternatively, the programmable logic resource configuration data may be stored in any other suitable volatile or nonvolatile memory including, for example, static random access memory (SRAM), dynamic random access memory (DRAM), Rambus DRAM (RDRAM), synchronous DRAM (SDRAM), double data rate-synchronous DRAM (DDR SDRAM), erasable programmable read-only memory (EPROM), FLASH memory, and magnetic RAM (MRAM).

Programmable logic resource configuration data stored in memory may be associated with one or more applications. For example, some of the programmable logic resource configuration data can be used to specify how the programmable components of a programmable logic resource are to be configured (i.e., to implement a specific application). Some binary digits of the programmable logic resource configuration data can be used to represent data (e.g., a control expression, an expected value). Other binary digits of the programmable logic resource configuration data can be used as part of the real-time operation of an application implemented by the programmable logic resource (e.g., if memory reads and writes are specified by the application). The programmable logic resource configuration data may be altered such that certain binary digits are erroneously represented (e.g., a binary digit that was previously a binary "1" is now a binary "0," and vice versa). The present invention provides a way to detect such errors.

The present invention is primarily discussed herein in terms of a cyclic redundancy check (CRC) checksum analysis to detect errors in programmable logic resources for specificity and clarity, though any other suitable approach may be used to detect errors in programmable logic resources. In a CRC checksum analysis, a checksum is computed. This checksum may be, for example, a remainder that results from a division operation involving data and a control expression. Alternatively, a checksum may be computed using any other suitable operation or combination of operations. The control expression may be any suitable data representation used to compute an expected value for the programmable logic resource configuration data.

The expected value is the checksum that results from an operation in which the data to be programmed into or the data that is being programmed into the programmable logic resource and the control expression are operands. This expected value may be user-defined or any other suitable entity. The expected value may be stored on the programmable logic resource in a register or in a memory, or in any other suitable location.

In one embodiment, a checksum is computed on the programmable logic resource configuration data and then compared to the expected value. No error is detected if the checksum and the expected value meet some predetermined relationship (e.g., the checksum and the expected value are equal, the checksum differs from the expected value by a predetermined offset or multiple).

In another embodiment of the present invention, the programmable logic resource configuration data is first loaded into an exclusive OR (XOR) tree. After the programmable logic resource configuration data is loaded, the expected value is then loaded into the XOR tree. The XOR tree computes a checksum on the loaded data and expected value based on the control expression. No error is detected if the checksum is equal to some predetermined value (e.g., the checksum is zero, the checksum is a predetermined offset).

The output generated by the error detection circuitry is sent to an output pin on the programmable logic resource, which may be monitored by user logic. If an error is detected, the user of the programmable logic resource may be given the opportunity to reload all of or a portion of the programmable logic resource configuration data, or to perform any other suitable action in response to the error detection.

A CRC module may be used to perform the CRC checksum analysis. The CRC module may be implemented using any suitable arrangement. For example, in one embodiment, the CRC module may be a hard-wired circuit resident on a programmable logic resource. In another embodiment, the CRC module may be programmed into a programmable logic resource. In another embodiment, the CRC module may be implemented as a separate device, external to a programmable logic resource, in which the CRC module may be coupled to the programmable logic resource using, for example, input/output (I/O) pins. In a further embodiment, the CRC module may be implemented in software that is executed using a microprocessor (e.g., on a computer). Any such implementation may be used in accordance with the present invention. For purposes of brevity and not by way of limitation, the present invention is primarily described herein in terms of a CRC module that is hard-wired onto a programmable logic resource.

Additional signals, registers, and control logic may be needed to implement error detection on a programmable logic resource, as will be described in more detail in connection with FIGS. 1-3. For example, a data bit in a specified register may be flagged to indicate the initiation of error detection. Additional signals may also be needed to prepare the error detection circuitry including, for example, signals to clear registers, to preset counters, and to enable and disable various control signals. Additional registers may also be needed including, for example, an address register for indexing a frame in the programmable logic resource configuration data and a data register for the temporary storage of the indexed frame before the data is loaded into the error detection circuitry.

In one suitable approach, a finite state machine (FSM) may be used to negotiate data communications between the CRC module and the programmable logic resource. More particularly, the FSM may direct the loading and shifting of data in the CRAM to the CRC module. Alternatively, the FSM may direct the loading and shifting of data in the CRAM to a temporary data register, and then from the data register to the CRC module. The CRC module includes a submodule for calculating the checksum on the programmable logic resource data and also, in some instances, the expected value. The submodule may be any suitable circuitry for performing the checksum analysis using, for example, a standard polynomial (e.g., the CRC-32 IEEE 802 standard), a sum of data, or any other suitable data representation.

The calculated checksum may then be sent to comparison circuitry where the checksum may be compared to the expected value, or to any suitable predetermined value. Comparison circuitry may be implemented using a comparator, an OR gate, an XOR gate, or any suitable logic gate or combination of logic gates.

FIG. 1 shows a block diagram of an illustrative programmable logic resource 100 having an expected value 102, programmable logic resource configuration data 104, a finite state machine (FSM) 108, and a CRC module 116. Expected value 102 may be stored in a register or in a memory on programmable logic resource 100. Programmable logic resource configuration data 104 may be stored in any suitable memory in programmable logic resource 100 such as, for example, configuration random access memory (CRAM). Programmable logic resource configuration data 104 sends data to CRC module 116 via a data path 112. Path 112 may be any suitable path or paths for transmitting data serially, in parallel, or a combination of the same.

FSM 108 may be used to negotiate data communications between CRC module 116 and programmable logic resource 100. FSM 108 detects the initiation of error detection and may generate and send a clock signal and other signals to programmable logic resource configuration data 104 via a path 106 to direct the loading of data 104 to CRC module 116 via path 112. FSM 108 may direct the error detection analysis in CRC module 116 via a path 114. Paths 106, 112, and 114 may be any suitable paths for sending data and various signals such as clocks, preset signals, or flags.

Data paths 106, 112, and 114 may be direct connections, may include intervening circuitry, or both. Such intervening circuitry may include, for example, registers, pipelining circuitry, multiplexers, or any other suitable circuitry that allows the various signals to be asserted/deasserted, enabled/disabled, or both at suitable times in order to coordinate the loading of data and the computation of the checksum.

Figure 2:
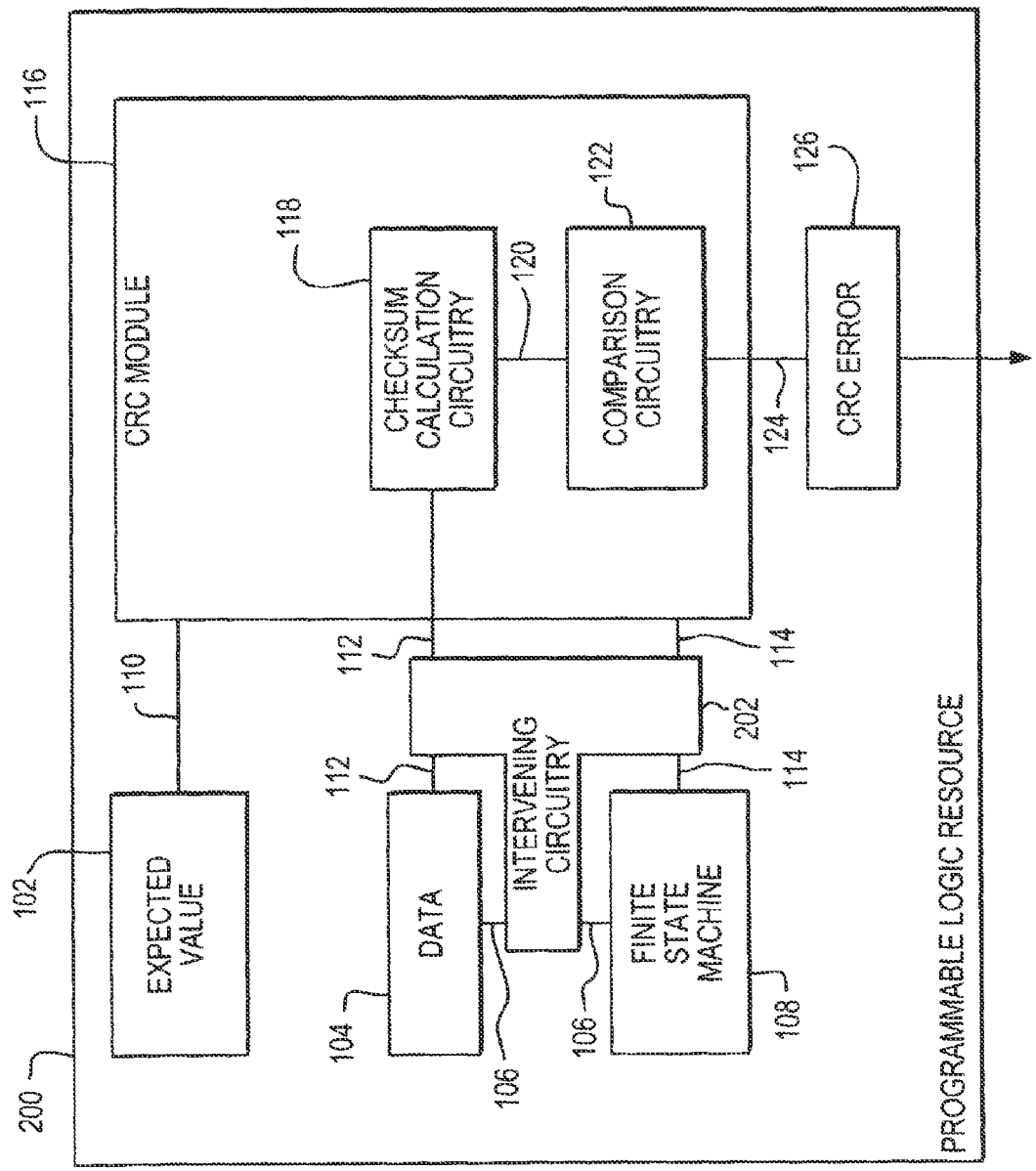
FIG. 2 is a block diagram of a programmable logic resource with error detection circuitry in accordance with another embodiment of the invention.

FIG. 2 shows a block diagram of an illustrative programmable logic resource 200 having intervening circuitry 202 in the paths between programmable logic resource configuration data 104, FSM 108, and CRC module 116. It will be understood that any illustrated path shown with respect to facilitating communication between components may include any suitable intervening circuitry.

Referring to FIG. 1, CRC module 116 includes checksum calculation circuitry 118 and comparison circuitry 122. Checksum calculation circuitry 118 accepts programmable logic resource configuration data 104 via path 112. Checksum calculation circuitry 118 computes a checksum on programmable logic resource configuration data 104 that may be used in a CRC checksum analysis. Any suitable approach may be used to compute the checksum on programmable logic resource configuration data 104. For example, a control expression, which may be represented as a polynomial such as the following CRC-32 IEEE 802 standard:

$$G(X) = X^{32} + X^{26} + X^{23} + X^{22} + X^{16} + X^{12} + X^{11} + X^{10} + X^8 + X^7 + X^5 + X^4 + X^2 + X^1 + 1 \quad (1)$$

may be used to generate the checksum

In one embodiment, the checksum may be computed by, for example, taking the modulo (mod) of data (e.g., programmable logic resource configuration data 104) with control expression (1), which is the remainder that results after dividing the data by the control expression. In another embodiment, a multiplication or shift operation may be performed on the data prior to performing the modulo operation on the data. It will be understood that any other suitable control expression may be used in generating the checksum in accordance with the present invention.

When programmable logic resource data 104 has been loaded into CRC module 116, expected value 102 is loaded into CRC module 116. Expected value 102 may be retrieved from any suitable source. In one embodiment, the expected value may be computed at the time of programming the data into programmable logic resource 100 using software. In another embodiment, the expected value may be computed at the time of programming the data into programmable logic resource 100 using CRC module 116 For example, as data is being programmed into programmable logic resource 100, the data is also being sent to CRC module 116 where the expected value is being computed. The expected value is preferably computed using the same checksum calculation to compute the checksum in CRC module 116.

In one embodiment of the present invention, programmable logic resource configuration data 104 may be sent to checksum calculation circuitry 118 to produce a checksum. This computed checksum is sent along data path 120 to comparison circuitry 122. Expected value 102 is also sent to comparison circuitry 122. In comparison circuitry 122, the computed checksum is compared to expected value 102 using any suitable logic gate or combination of logic gates (e.g., a comparator, an XOR gate, a subtractor). If the checksum and expected value 102 meet some predetermined relationship (e.g., the checksum and expected value 102 are equal, the checksum differs from expected value 102 by a predetermined offset or multiple), comparison circuitry 122 will produce an output (e.g., a binary "0") indicating that no error has been detected. However, if the checksum and expected value 102 do not meet this predetermined relationship (e.g., the checksum is different from expected value 102, the checksum differs from expected value 102 by a different offset), comparison circuitry 122 will generate a different output (e.g., a binary "1") indicating that an error has been detected. The output of comparison circuitry 122 will be sent to a CRC error pin 126 via a path 124. CRC error pin 126 may be accessed by a user to monitor the presence of errors in programmable logic resource configuration data 104.

In another embodiment of the present invention, programmable logic resource configuration data 104 and expected value 102 are both sent to checksum calculation circuitry 118 to compute a checksum. For example, programmable logic resource configuration data may be multiplied or shifted by a number of bits equal to the degree of the control expression (e.g., for the CRC-32 IEEE 802 standard, the degree is the exponent of the largest monomial which is 32). Expected value 102 (which is computed using the same calculation) may be appended to the end of programmable logic resource configuration data 104 (i.e., the bits representing expected value 102 may be appended to the bits representing programmable logic resource configuration data 104) and sent through checksum calculation circuitry 118.

The computed checksum is then sent along data path 120 to comparison circuitry 122. In comparison circuitry 122, a logic operation may be performed on the computed checksum using, for example, a logic gate or a combination of logic gates (e.g., a comparator, an OR gate, an adder, etc). If the checksum is equal to some predetermined value (e.g., the checksum is zero, the checksum is a predetermined offset), comparison circuitry 122 will produce an output (e.g., a binary "0") indicating that no error has been detected. However, if the checksum is some value other than the predetermined value (e.g., the checksum is non-zero, the checksum is different from the predetermined offset), comparison circuitry 122 will generate a different output (e.g., a binary "1") indicating that an error has been detected. Comparison circuitry 122 may produce any suitable output indicating whether an error has been detected. This output will be sent along path 124 to CRC error pin 126.

Figure 3:
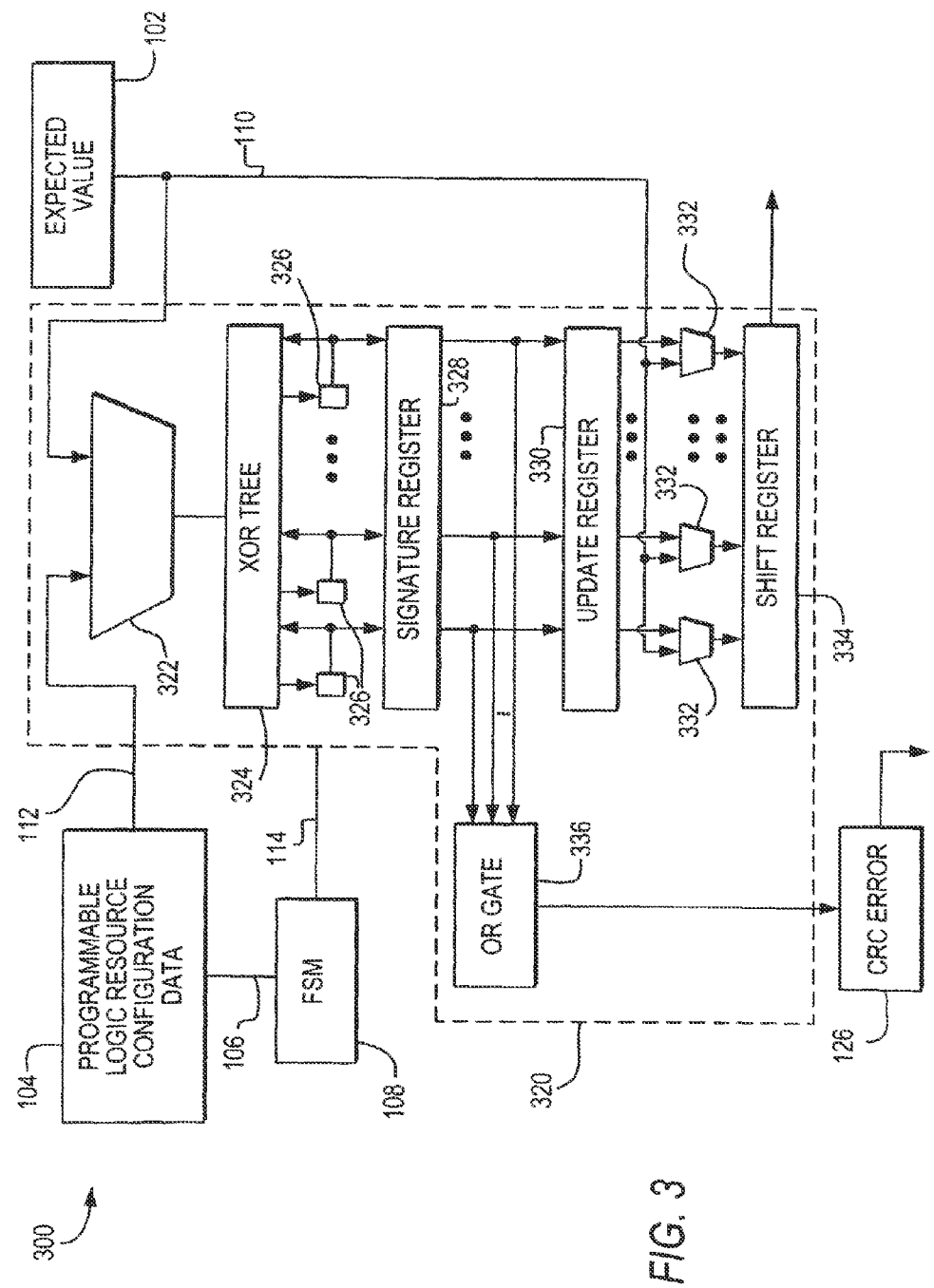
FIG. 3 is a more detailed block diagram of the programmable logic resource with error detection circuitry of FIG. 1 in accordance with one embodiment of the invention.

FIG. 3 shows a block diagram of an illustrative programmable logic resource 300. CRC module 320 can include multiplexers 322 and 332, an XOR tree 324, registers 326, 328, 330, and 334, and one or more logic gates such as an OR gate 336. Programmable logic resource configuration data 104 and expected value 102 may be inputs to multiplexer 322. A multiplexer selects one input to send to its output depending on the value of a select signal that is monitored by FSM 108. For example, FSM 108 can set the select signal to a first binary bit (e.g., a binary "0") that indicates to multiplexer 322 to select a first input that receives programmable logic resource configuration data 104 via path 112 to the output. After programmable logic resource configuration data 104 has been sent to the output, FSM 108 can set the select signal to a second binary bit (e.g., a binary "1") that indicates to multiplexer 322 to select a second input that receives expected value 102 via path 110 to the output. The output of multiplexer 322 is sent to XOR tree 324 where the checksum is computed.

In one embodiment, XOR tree 324 may compute the checksum using a control expression such as the CRC-32 IEEE 802 standard in expression (1). While any suitable control expression may be used, the same or equivalent control expression is preferably used to compute expected value 102. As XOR tree 324 receives programmable logic resource configuration data 104 followed by expected value 102, XOR tree 324 processes the loaded data. The output of XOR tree 324 is coupled to registers 326, where the data may be sent back to XOR tree 324 in a subsequent cycle for further processing. Registers 326 may be latches, flip-flops (e.g., D flip-flops, J-K flip-flops), or any suitable storage device controlled by a clocking mechanism. XOR tree 324 and registers 326 may make up part of checksum calculation circuitry 118.

Data may be sent through multiplexer 322 and loaded into XOR tree 324 serially, in parallel, or a combination of the same. In one embodiment, one data bit may be loaded and processed in XOR tree 324 each clock cycle. In another embodiment, a multiple number (e.g., 2, 8, 16) of data bits may be loaded and processed in XOR tree 324 each clock cycle.

Figure 4:
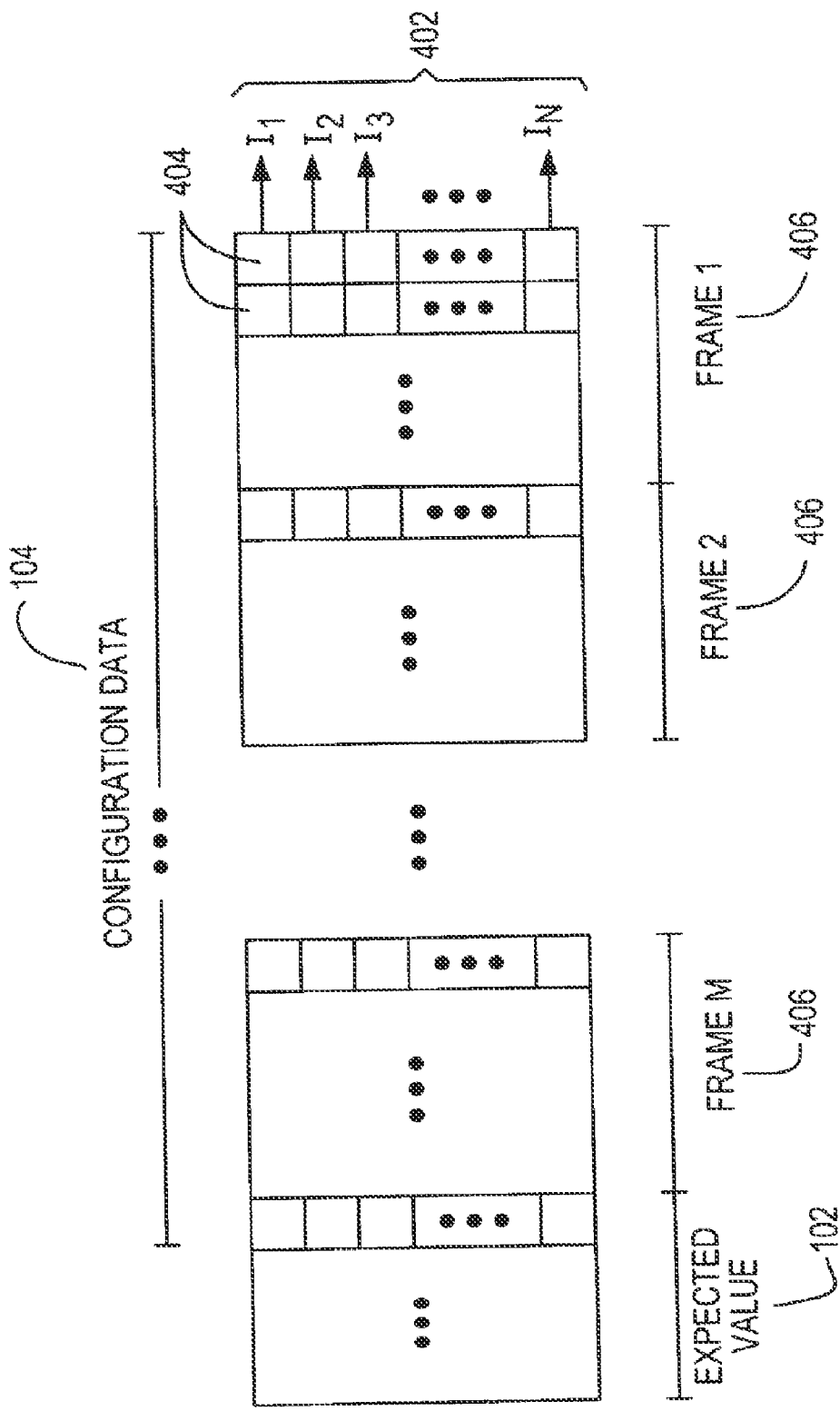
FIG. 4 is a diagram of input data to a multiple input XOR tree in accordance with one embodiment of the invention.

FIG. 4 illustrates a sequence of data sent in as input 402 to XOR tree 324. Programmable logic resource configuration data 104 may be divided into multiple frames (e.g., M frames) 406. Data 104 is loaded one frame 406 at a time (e.g., Frame 1, Frame 2, . . . , Frame M). Within each frame 406, a multiple number of bits (e.g., N bits) 404 are loaded at a time. Data may be loaded from most significant bit to least significant bit. In each clock cycle, each bit 404 is sent through a different data path (e.g., $I_1, I_2, \ldots, I_N$) 402 to XOR tree 324. After data 104 has been loaded, expected value is similarly loaded into XOR tree 324. If the total number of bits (e.g., of configuration data 104 and expected value 102) is not a multiple of the number of inputs (N) 402, the sequence of data may be padded with additional bits (e.g., binary "1s" or "0s"). These additional bits may be padded to the beginning of the sequence of data, the end of the sequence of data, or any other suitable location.

XOR tree 324 and registers 326 may be implemented by the following matrix equation:

$$Q = A^*q + B^*I_N \qquad (2)$$

A matrix includes data arranged in one or more rows with one or more columns with the following notation:

$$X_{R \times C} = \begin{bmatrix} (1,1) & (1,2) & \ldots & (1,C) \\ (2,1) & & & \\ \vdots & & & \vdots \\ (R,1) & & \ldots & (R,C) \end{bmatrix} \qquad (3)$$

R represents the number of rows and C represents the number of columns.

"A" is a d×d matrix representing registers 326 and the control expression, where d is the degree of the highest monomial of the control expression. "q" is a d×1 matrix representing the contents currently stored in registers 326 from a previous clock cycle. "B" is a d×1 matrix representing the coefficients for each monomial in the control expression. "$I_N$" is a constant representing input bits 402. "Q" is a d×1 matrix representing the output of XOR tree 324 in a next cycle (e.g., the result of processing input bits 402 with the contents stored in registers 326 in a previous clock cycle).

Based on matrix equation (2), the equation for processing N input bits each clock cycle is as follows:

$$1 \text{ input: } Q_1 = Aq + BI_1 \qquad (4)$$

$$2 \text{ inputs: } Q_2 = A^2q + ABI_1 + BI_2 \qquad (5)$$

$$3 \text{ inputs: } Q_3 = A^3q + A^2BI_1 + ABI_2 + BI_3 \qquad (6)$$

$$\vdots$$

$$N \text{ inputs: } Q_N = A^Nq + A^{N-1}BI_1 + \ldots + ABI_{N-1} + BI_N \qquad (7)$$

Figure 5:
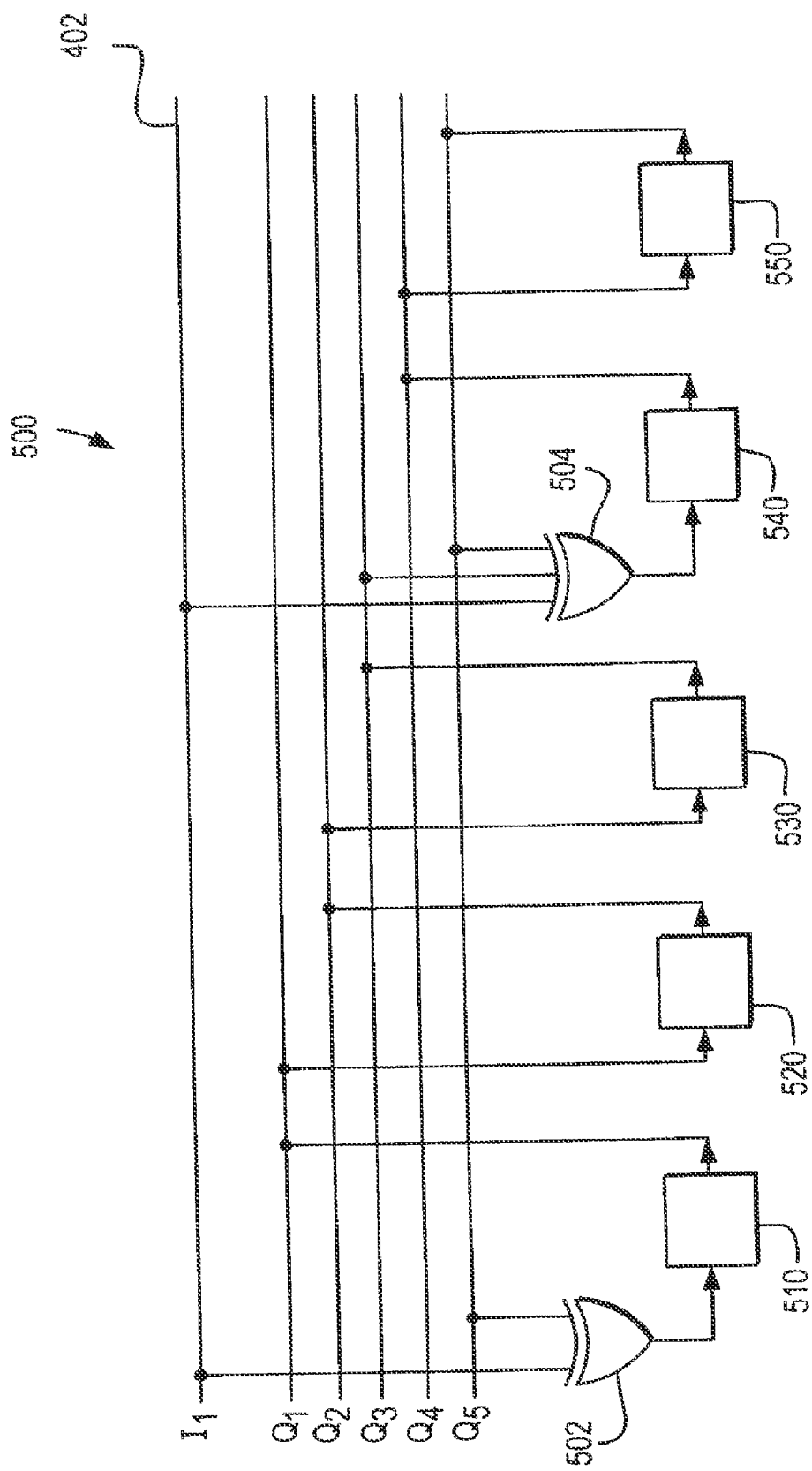
FIG. 5 is a diagram of an illustrative single input XOR tree that may be implemented in error detection circuitry in accordance with one embodiment of the invention.

FIG. 5 is one illustrative embodiment of circuitry 500 that includes XOR tree 324 and registers 326 (e.g., checksum calculation circuitry 118). Circuitry 500 processes one input bit (e.g., $I_1$) each clock cycle. As an illustration, the control expression is represented by the following:

$$G(X) = X^5 + X^3 + 1 \qquad (8)$$

Because the degree of G(X) in expression (8) is five, there are five registers 326 used to store the output of XOR tree 324. The output of circuitry 500 is represented by equation (4), whose matrices are as follows:

$$A = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 1 \\ 0 & 0 & 0 & 1 & 0 \end{bmatrix} \quad (9)$$

$$q = \begin{bmatrix} q^1 \\ q^2 \\ q^3 \\ q^4 \\ q^5 \end{bmatrix} \quad (10)$$

$$B = \begin{bmatrix} 1 \\ 0 \\ 0 \\ 1 \\ 0 \end{bmatrix} \quad (11)$$

"A" is a 5×5 matrix with the first four columns representing registers 326 and the last column representing the coefficients of the monomials in control expression (8). "q" is a 5×1 matrix representing the contents of registers 326 (e.g., $q_1$, $q_2$, $q_3$, $q_4$, and $q_5$ represent the contents of registers 510, 520, 530, 540, and 550, respectively). "B" is a 5×1 matrix representing the coefficients of the monomials in control expression (8). Substituting expressions (9), (10), and (11) into equation (3) produces the following output:

$$Q_1 = \begin{bmatrix} q^5 + I_1 \\ q^1 \\ q^2 \\ q^3 + q^5 + I_1 \\ q^4 \end{bmatrix} \quad (12)$$

$Q_1$ is a 5×1 matrix that represents the contents of registers 326 in a next cycle as follows: $(q_5+I_1)$, $q_1$, $q_2$, $(q_3+q_5+I_1)$, and $q_4$. The outputs of $Q_1$ are binary (e.g., "0" or "1") and may be implemented using XOR gates.

Circuitry 500 includes XOR gates 502 and 504 and registers 510, 520, 530, 540, and 550, which may be part of registers 326 controlled by a single clock. The input to register 510 is the output of XOR gate 502, whose inputs are $I_1$ (from the output of multiplexer 322) and the current content of register 550. In a next cycle, the content of register 510 is $Q_{1(1,1)}=q_5+I_1$. The input to register 520 is the current content of register 510 so that in a next cycle, the content of register 520 is $Q_{1(2,1)}=q_1$. The input to register 530 is the current content of register 520 so that in a next cycle, the content of register 530 is $Q_{1(3,1)}=q_2$. The input to register 540 is the output of XOR gate 504 whose inputs are $I_1$ and the current contents of registers 530 and 550. XOR gate 504 may be implemented using a three-input XOR gate or two, two-input XOR gates, where two of the inputs are sent through a first XOR gate with the output of the first XOR gate and the third input being sent through a second XOR gate. In a next cycle, the content of register 540 is $Q_{1(4,1)}=q_3+q_5+I_1$. The input to register 550 is the current content of register 540 so that in a next cycle, the content of register 550 is $Q_{1(5,1)}=q_4$. Although not shown, the contents of registers 510, 520, 530, 540, and 550 are also sent as input to signature register 328.

Figure 6:
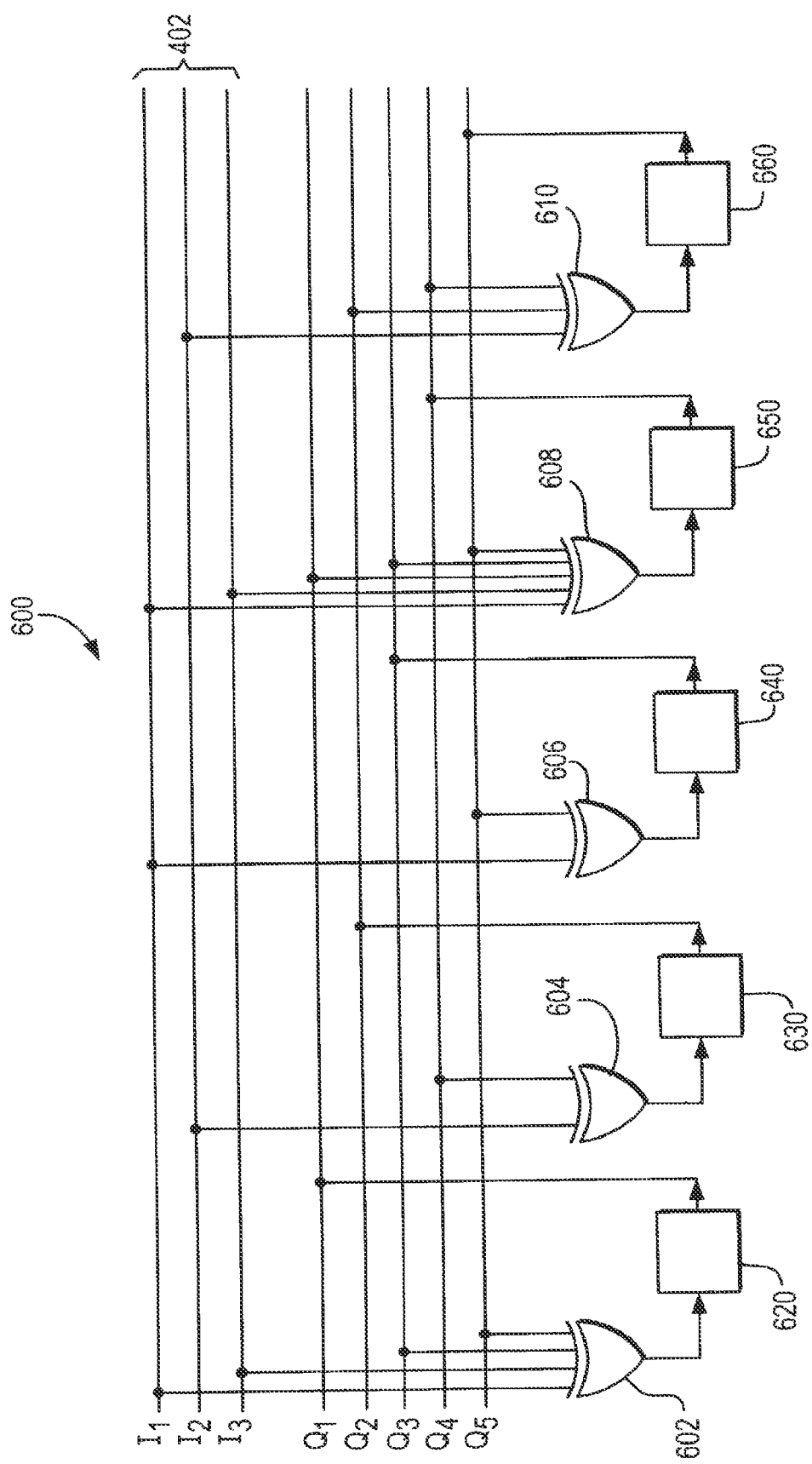
FIG. 6 is a diagram of an illustrative multiple input XOR tree that may be implemented in error detection circuitry in accordance with one embodiment of the invention.

FIG. 6 is another illustrative embodiment of circuitry 600 that includes XOR tree 324 and registers 326. Circuitry 600, which uses the same control expression (8), processes three input bit (e.g., $I_1$, $I_2$, $I_3$) each clock cycle. Substituting expressions (9), (10), and (11) into equation (5) produces the following outputs:

$$Q_3 = \begin{bmatrix} q^3 + q^5 + I_1 + I_3 \\ q^4 + I_2 \\ q^5 + I_1 \\ q^1 + q^3 + q^5 + I_1 + I_3 \\ q^2 + q^4 + I_2 \end{bmatrix} \quad (13)$$

Circuitry 600 includes XOR gates 602, 604, 606, 608, and 610, and registers 620, 630, 640, 650, and 660, which may be part of registers 326 controlled by a clock. The input to register 620 is the output of XOR gate 602, whose inputs are $I_1$ and $I_3$ (both from the output of multiplexer 322) and the current contents of registers 640 and 660. In a next cycle, the content of register 620 is $Q_{3(1,1)}=q_3+q_5+I_1+I_3$. The input to register 630 is the output of XOR gate 604, whose inputs are $I_2$ (from the output of multiplexer 322) and the current content of register 650. In a next cycle, the content of register 630 is $Q_{3(2,1)}=q_4+I_2$. The input to register 640 is the output of XOR gate 606, whose inputs are $I_1$ and the current content of register 660. In a next cycle, the content of register 640 is $Q_{3(3,1)}=q_5+I_1$. The input to register 650 is the output of XOR gate 608, whose inputs are $I_1$ and $I_3$ and the current contents of registers 620, 640, and 660. In a next cycle, the content of register 650 is $Q_{3(4,1)}=q_1+q_3+q_5+I_1+I_3$. The input to register 660 is the output of XOR gate 610, whose inputs are $I_2$ and the current contents of registers 630 and 650. In a next cycle, the content of register 660 is $Q_{3(5,1)}=q_2+q_4+I_2$. XOR gates 602, 608, and 610 may be implemented using any suitable XOR gate or combination of XOR gates. Although not shown, the contents of registers 620, 630, 640, 650, and 660 are also sent as input to signature register 328.

Circuitry 500 and 600 are described in the context of implementing a checksum calculation based on control expression (8) that takes as input one bit and three bits, respectively, each clock cycle for merely illustrative purposes. However, XOR tree 324 may be implemented using any suitable control expression (e.g., the CRC-32 IEEE 802 standard) and any suitable number of input bits each clock cycle.

As data is being sent as inputs 402 to XOR tree 324, the contents of registers 326 are being updated. After programmable logic resource configuration data 104 and expected value 102 are processed, the contents of registers 326 hold the resulting checksum. In one embodiment, the resulting checksum is zero if there are no errors present, as shown by the following proof.

Let variables G(X), M(X), Q(X), EV, and μ(X) represent the following:

G(X)=CRC-32 IEEE 802 standard;

M(X)=Programmable logic resource configuration data 104;

Q(X)=Quotient=M(X)/G(X);

EV=Expected value=M(X)(mod)G(X);

μ(X)=Data sent in as input 402. (14)

In performing the checksum calculation on M(X) to compute the expected value, the following is derived:

$$X^{32}M(X) \equiv EV (\mathrm{mod}) G(X) \quad (15)$$

The symbol "≡" represents congruence and refers to a class of remainders equivalent to EV (mod) G(X) (where EV is the smallest member in the class). M(X) is defined as the following:

$$X^{32}M(X) = Q(X)G(X) + EV \quad (16)$$

Input 402 to XOR tree 324 can be represented as follows:

$$\mu(X) = X^{32}M(X) + EV \quad (17)$$

M(X) is multiplied or shifted by an offset $X^{32}$ (i.e., by the degree of control expression G(X)) with the expected value being appended to M(X). Performing algebraic manipulations to equation (17), we get the following:

1. Multiply both sides by $X^{32}$:

$$X^{32}\mu(X) = X^{32}[X^{32}M(X) + EV]$$

2. Substitute $X^{32}M(X)$ with equation (16):

$$X^{32}\mu(X) = X^{32}[Q(X)G(X) + EV + EV]$$

3. Write in congruent form.

$$X^{32}\mu(X) \equiv X^{32}[EV + EV] \equiv 2EV \equiv 0 \quad (18)$$

The term $X^{32}Q(X) G(X)$ is a multiple of ((mod) G(X)) and so is not present in the congruent form. Taking the XOR of 2EV is congruent to zero in binary form (i.e., the output of a two-input XOR gate is zero when both inputs are the same value).

The following is a simplified example of how one embodiment of XOR tree 324 and registers 326 functions. Suppose the data that is to be programmed in the programmable logic resource contains the sequence of data bits b110110001, which can be represented as the following polynomial:

$$M(X) = X^8 + X^7 + X^5 + X^4 + 1 \quad (19)$$

Suppose also that the control expression is the sequence of data bits b101001, which represents control expression (8). Prior to programming the data M(X) in the programmable logic resource, the expected value is computed. The expected value (EV) is the remainder that results from dividing the data M(X) by the control expression G(X) using the same approach in computing the checksum in XOR tree 324.

$$EV = X^5 M(X)(\mathrm{mod}) G(X) = X^3 + X^2 \quad (20)$$

(i.e., b10111). Because XOR tree 324 multiplies or shifts programmable logic resource configuration data 104 by the degree of the control expression and appends expected value 102 to programmable logic resource configuration data 104 to compute the checksum, the data M(X) is similarly multiplied or shifted by the degree in order to compute expected value 102.

After the data is programmed in as programmable logic resource configuration data 104, a flag may be raised signaling the start of error detection. The following is an illustration of processing programmable logic resource configuration data 104 that has not been changed (i.e., there are no errors).

$$P(X) = M(X) \quad (21)$$

This programmed data is sent to XOR tree 324 as will be described in further detail in connection with FIGS. 7-15. After the programmed data is loaded into XOR tree 324, the expected value is loaded into XOR tree 324 as follows:

$$X^5 P(X) + EV = X^{13} + X^{12} + X^{10} + X^9 + X^5 + X^3 + X^2 \quad (22)$$

$$= b11011000101100$$

The remainder that results from dividing expression (22) by the control expression G(X) is zero, which is what we expect since there are no errors.

$$(X^5 P(X) + EV)(\mathrm{mod}) G(X) = b0 \quad (23)$$

If XOR tree 324 accepts one input (e.g., $I_1$) each clock cycle, XOR tree 324 will be implemented as shown in FIG. 5 (for control expression (8)). Table 1 shows the contents of registers 510, 520, 530, 540, and 550 as circuitry 500 computes the checksum.

TABLE 1

| $I_1$ | Reg. 510 | Reg. 520 | Reg. 530 | Reg. 540 | Reg. 550 |
|---|---|---|---|---|---|
|   | 0 | 0 | 0 | 0 | 0 |
| 1 | 1 | 0 | 0 | 1 | 0 |
| 1 | 1 | 1 | 0 | 1 | 1 |
| 0 | 1 | 1 | 1 | 1 | 1 |
| 1 | 0 | 1 | 1 | 1 | 1 |
| 1 | 0 | 0 | 1 | 1 | 1 |
| 0 | 1 | 0 | 0 | 0 | 1 |
| 0 | 1 | 1 | 0 | 1 | 0 |
| 0 | 0 | 1 | 1 | 0 | 1 |
| 1 | 0 | 0 | 1 | 1 | 0 |
| 0 | 0 | 0 | 0 | 1 | 1 |
| 1 | 0 | 0 | 0 | 0 | 1 |
| 1 | 0 | 0 | 0 | 0 | 0 |
| 0 | 0 | 0 | 0 | 0 | 0 |
| 0 | 0 | 0 | 0 | 0 | 0 |

The output of circuitry 500 is zero.

If XOR tree 324 accepts three inputs (e.g., $I_1$, $I_2$, $I_3$) each clock cycle, XOR tree 324 will be implemented as shown in FIG. 6 (for control expression (8)). Because the total number of bits to XOR tree 324 is not a multiple of the number of input bits (e.g., 3) sent to XOR tree 324 each clock cycle, the data is padded with an additional bit (e.g., binary "0") at the beginning of the data stream. Table 2 shows the contents of registers 620, 630, 640, 650, and 660 as circuitry 600 computes the checksum.

TABLE 2

| $I_1$ | $I_2$ | $I_3$ | Reg. 620 | Reg. 630 | Reg. 640 | Reg. 650 | Reg. 660 |
|---|---|---|---|---|---|---|---|
|   |   |   | 0 | 0 | 0 | 0 | 0 |
| 0 | 1 | 1 | 1 | 1 | 0 | 1 | 1 |
| 0 | 1 | 1 | 0 | 0 | 1 | 1 | 1 |
| 0 | 0 | 0 | 0 | 1 | 1 | 0 | 1 |
| 1 | 0 | 1 | 0 | 0 | 0 | 0 | 1 |
| 1 | 0 | 0 | 0 | 0 | 0 | 0 | 0 |

The output of circuitry 600 is zero.

The following is an illustration of processing programmable logic resource configuration data 104 that has been changed (i.e., there are errors).

$$P(X) = X^8 + X^7 + X^5 + 1 \quad (24)$$

P(X) has one bit that has been inverted. The programmed data and the expected value are loaded into XOR tree 324 as follows:

$$X^5 P(X) + EV = X^{13} + X^{12} + X^{10} + X^5 + X^3 + X^2 \quad (25)$$
$$= b11010000101100$$

The remainder that results from dividing polynomial (25) by control expression (8) is nonzero, indicating that an error has occurred.

$$(X^5 P(X) + EV)\%G(X) = b11101 \quad (26)$$

Table 3 shows the contents of registers 620, 630, 640, 650, and 660 as circuitry 600 computes the checksum.

TABLE 3

| $I_1$ | $I_2$ | $I_3$ | Reg. 620 | Reg. 630 | Reg. 640 | Reg. 650 | Reg. 660 |
|---|---|---|---|---|---|---|---|
|   |   |   | 0 | 0 | 0 | 0 | 0 |
| 0 | 1 | 1 | 1 | 1 | 0 | 1 | 1 |
| 0 | 1 | 0 | 1 | 0 | 1 | 0 | 1 |
| 0 | 0 | 0 | 0 | 0 | 1 | 1 | 0 |
| 1 | 0 | 1 | 1 | 1 | 1 | 1 | 1 |
| 1 | 0 | 0 | 1 | 1 | 0 | 0 | 0 |

Some of the outputs of registers 620, 630, 640, 650, and 660 are nonzero, signaling an error.

Referring to FIG. 3, the contents of registers 326 are sent to signature register 328 after each clock cycle. After programmable logic resource configuration data 104 and expected value 102 are processed in XOR tree 324, the signature register contains the computed checksum. Because the contents of signature register 328 are updated each clock cycle, FSM 108 directs update register 330 to store the contents of signature register 328 when its contents are valid (i.e., after the computed checksum is stored in signature register 328).

The user may view either the computed checksum or expected value 102. By monitoring the computed checksum, the user can determine the uniqueness of any detected errors. For example, the user may determine if the errors are random (e.g., a different checksum is generated over multiple computations) or whether the same error repeatedly occurs (e.g., the same checksum is generated over multiple computations).

The user may view the computed checksum or expected value 102 using any suitable approach. In one embodiment, each multiplexer 332 takes as input one bit from update register 330 and one bit from expected value 102. Depending on which value the user wants to view, FSM 108 directs multiplexers 332 to select either data from update register 330 or expected value 102. The output of each multiplexer 332 is sent to shift register 334. Shift register 334 is accessible by programmable logic resource 300 and allows its contents to be read by user logic.

Errors may occur affecting the computed checksum when the data is accessed from shift register 334. In a more accurate way to detect errors, once the computed checksum is in signature register 328, each bit in signature register 328 may be sent to a separate input of an OR gate 336. OR gate 336 may include one gate with a number of inputs equal to a number of signature register bits, or may include a cascade of gates, each with a smaller number of inputs, or any other suitable approach for comparing the signature register bits. If all the signature register bits are binary "0," the output of OR gate 336 will be binary "0," indicating that no error has been detected. If one or more signature register bits are binary "1," the output of OR gate 336 will be binary "1," indicating that an error has been detected. The output of OR gate 336 is sent to CRC error pin 338 which can be monitored by user logic.

CRC error pin 338 may hold one data bit in which one value indicates that no error was detected while a second value indicates that an error has been detected. Alternatively, CRC error pin 338 may be an indicator, for example, a light emitting diode (LED), that signals (e.g., lights up the LED) when an error is detected. Any other suitable approach may be used to signal an error.

FSM 108 sends signals to the various registers in CRC module 320 to coordinate the sampling of data. For example, FSM 108 sends a clock enable signal to update register 330 after XOR tree 324 has finished processing and signature register 328 contains the checksum. The clock enable signal is coordinated so that update register 330 does not read the contents of signature register 328 at the same time that signature register 328 is reading data from registers 326. Only when a user requests to view the checksum or expected value 102 is the data sent through multiplexers 332 to shift register 334.

Figure 7:
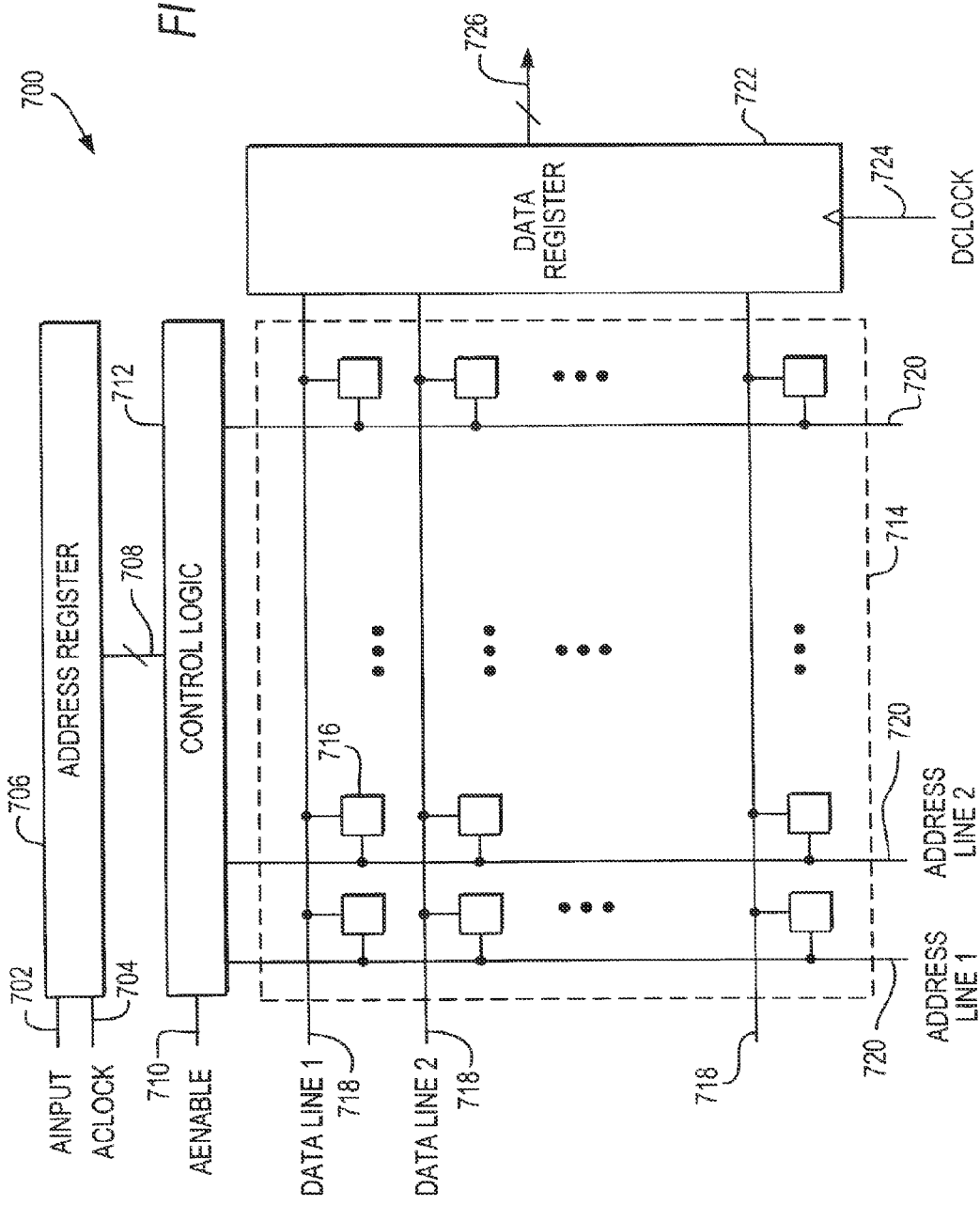
FIG. 7 is a block diagram illustrating how programmable logic resource configuration data is stored in accordance with one embodiment of the invention.

FIG. 7 illustrates a memory core 700 in a programmable logic resource in accordance with one embodiment of the present invention. Memory core 700 includes an address register 706, control logic 712, programmable logic resource configuration data 714, and a data register 722. Data 714 may be arranged in an array including rows and columns of data cells 716, where each data cell 716 contains one binary digit. For data 714 arranged in an array, a data line 718 may be associated with each row of cells 716 and an address line 720 may be associated with each column of cells 716.

Programmable logic resource configuration data 714 may be organized in any suitable arrangement and may have its data cells 716 coupled to data lines and address lines in any suitable arrangement. For purposes of brevity and clarity, data 714 is primarily described herein as an array of data cells 716 with data lines 718 extending across rows of data cells 716 and address lines 720 extending across columns of data cells 716 for specificity and clarity.

Address register 706 may be used to select an address line 720 for loading a corresponding column of data cells 716. Each column of cells 716 may represent a frame and be associated with a different address bit in address register 706. Address register 706 may have a number of bits equal to the number of frames, with each bit in address register 706 corresponding to one address line 720.

Address register 706 has two input signals, an address register input (AINPUT) signal 702 and an address register clock (ACLOCK) signal 704. Input signal 702 can be asserted (e.g., set to binary "1") with a first pulse by address register clock signal 704, causing a first bit location in address register 706, which corresponds to a first frame, to be set to binary "1." After the first pulse by address register clock signal 704, input signal 702 can be deasserted (e.g., set to binary "0"). With each subsequent pulse by address register clock signal 704, the binary "1" in address register 706 is shifted by one bit location to index a next frame. The output of address register 706 is sent via data path 708 to control logic 712. Control logic 712 is controlled by an address enable (AENABLE) signal 710, which allows one address line 720 to be selected at the appropriate time.

When a frame is selected, the binary digits stored in the selected data cells 716 are written onto corresponding data lines 718, where they are loaded into data register 722 when the data register clock (DCLOCK) signal 724 is pulsed. Data register 722 can be a dedicated register used only during the loading of frames or can be a shared register used for different functions at different times (e.g., data register 722 can be the same register used during configuration of programmable logic resource configuration data 714 onto the programmable logic resource). The contents of data register 722 are subsequently loaded into error detection circuitry via data path 726.

Figure 8:
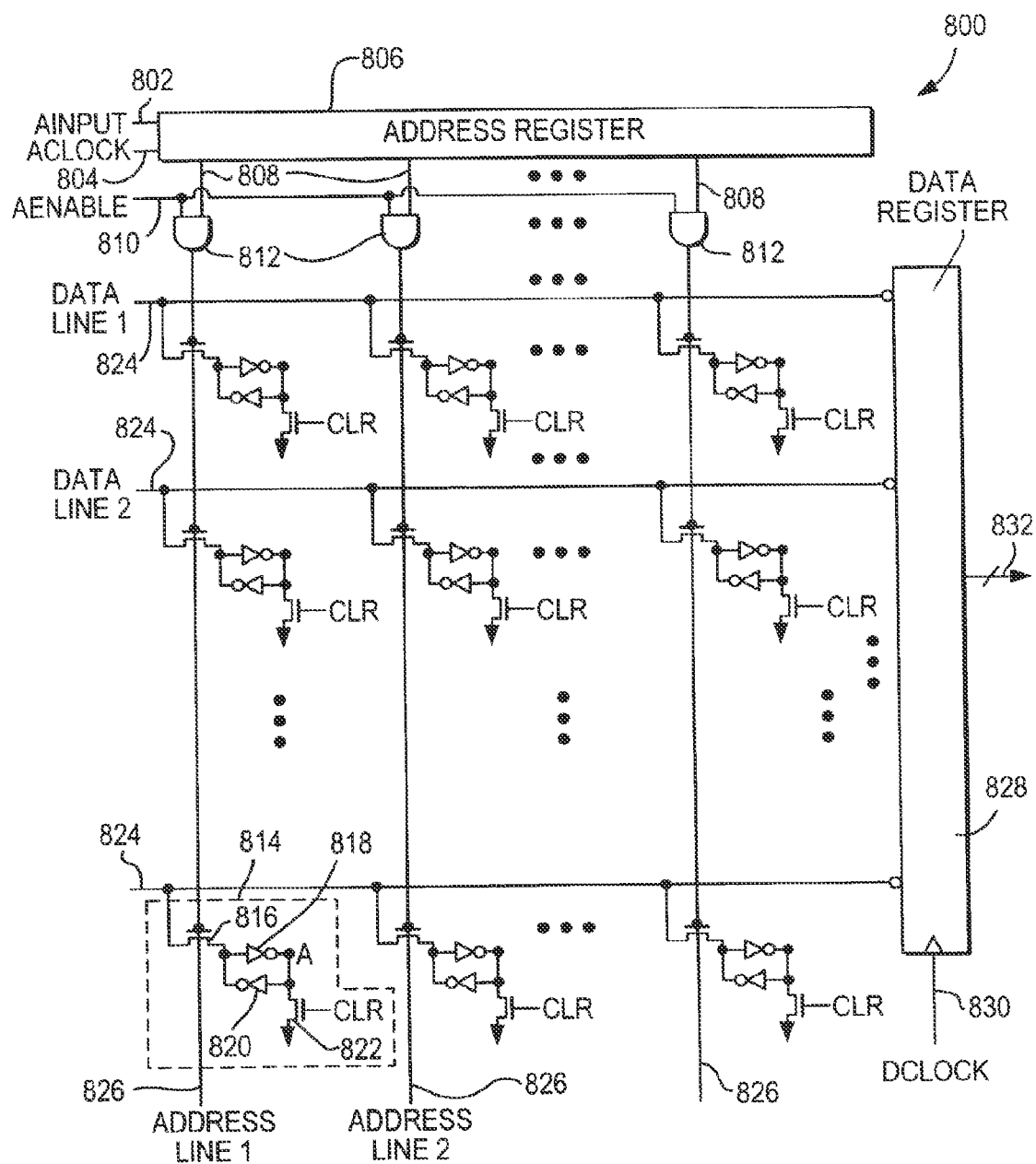
FIG. 8 is a schematic diagram illustrating how programmable logic resource configuration data is stored in accordance with one embodiment of the invention.

FIG. 8 illustrates a more detailed memory core 800 in a programmable logic resource in accordance with one embodiment of the invention. Memory core 800 includes an address register 806 with the following inputs: address register input (AINPUT) signal 802 and address register clock (ACLOCK) signal 804. Each bit location in address register 806 sends its bit value along path 808 to an input AND gate 812, which may be part of control logic 712. The second input to each AND gate 812 is address enable signal 810. The output is binary "1" when both inputs are binary "1." The output of each AND gate 812 is sent along a corresponding address line 826. Because at most one bit value in address register 806 is set to binary "1" at any cycle, at most one address line is activated at any one clock cycle. Coupled to each address line 826 is a frame of data cells 814, which can be, for example, configuration random access memory (CRAM) cells or any other suitable memory cells. Coupled to each data line 824 is a row of data cells 814.

Each CRAM cell 814 includes, for example, two transistors 816 and 822, and two inverters 818 and 820. Transistors 816 and 822 may be any suitable transistors including bipolar junction transistor (BJTs), field-effect transistors (FETS), and metal-oxide semiconductor FETS (MOSFETS). Transistor 816, for example, may be a MOSFET with a source node coupled to a corresponding data line 824, a gate node coupled to a corresponding address line 826, and a drain node coupled to inverters 818 and 820. The input of each inverter 818 and 820 is coupled to the output of the other inverter 820 and 818, respectively. Transistor 822, for example, can be a MOSFET with a source node coupled to inverters 818 and 820, a gate node coupled to a clear (CLR) signal, and a drain node coupled to a common ground. The clear signal can be used for programming a data bit to cell 814 and is not generally used for reading the data bits.

The binary digit in each data cell 814 is represented at node A. When a data line 824 is set to binary "1" (i.e., is precharged to a predetermined voltage) and an address line 826 is set to binary "1," the value in a corresponding CRAM cell 814 is read. If node A represents a binary "1," that data line 824 is discharged (i.e., driven to binary "0"). If node A represents a binary "0," that data line 824 remains precharged (i.e., set to binary "1"). The value read onto each data line 824 is sent to data register 828 when data register clock (DCLOCK) signal 830 is pulsed. An inverter may be coupled to each data line 824 to invert the binary representation of the data prior to the data being sent to data register 828. Data can be read from data register 828 via data path 832. Data path 832 may be any suitable path for transmitting data, including a serial bus, a parallel bus, or a combination of the same. The entire contents of data register 828 or a subset of the data (e.g., 1 data bit, 8 data bits, 16 data bits, 32 data bits) may be sent to path 832 for a given cycle.

FIGS. 9-15 are flow diagrams of illustrative steps for loading data to error detection circuitry such as to CRC module 320. Each frame may include a column of data bits, a row of data bits, a block of data bits, or any other suitable arrangement of data bits, but is primarily described herein in the context of a column of data bits for clarity and specificity. An address bit in an address register may be associated with each frame such that when a particular address bit is set (e.g., to binary "1"), the corresponding frame may be selected. Programmable logic resource configuration data 104 stored in a memory such as, for example, CRAM, may be read out one frame at a time and stored into a temporary data register where the data is then loaded into CRC module 320.

Flow 900 begins at step 910 in an idle mode. Next, at step 920, flow 900 determines whether error detection begins, which can be indicated by a flag. This flag may be raised when an application (e.g., an error detection application or any other suitable application) is about to run that needs access to data in the CRAM. This may be signaled by, for example, a dedicated bit in a register being asserted to binary "1" when the system is in user mode. If the flag is not raised, flow 900 remains at step 920. If the flag is raised, flow 900 moves to step 1000 where flow 900 prepares to load a first frame into the data register.

Figure 10:
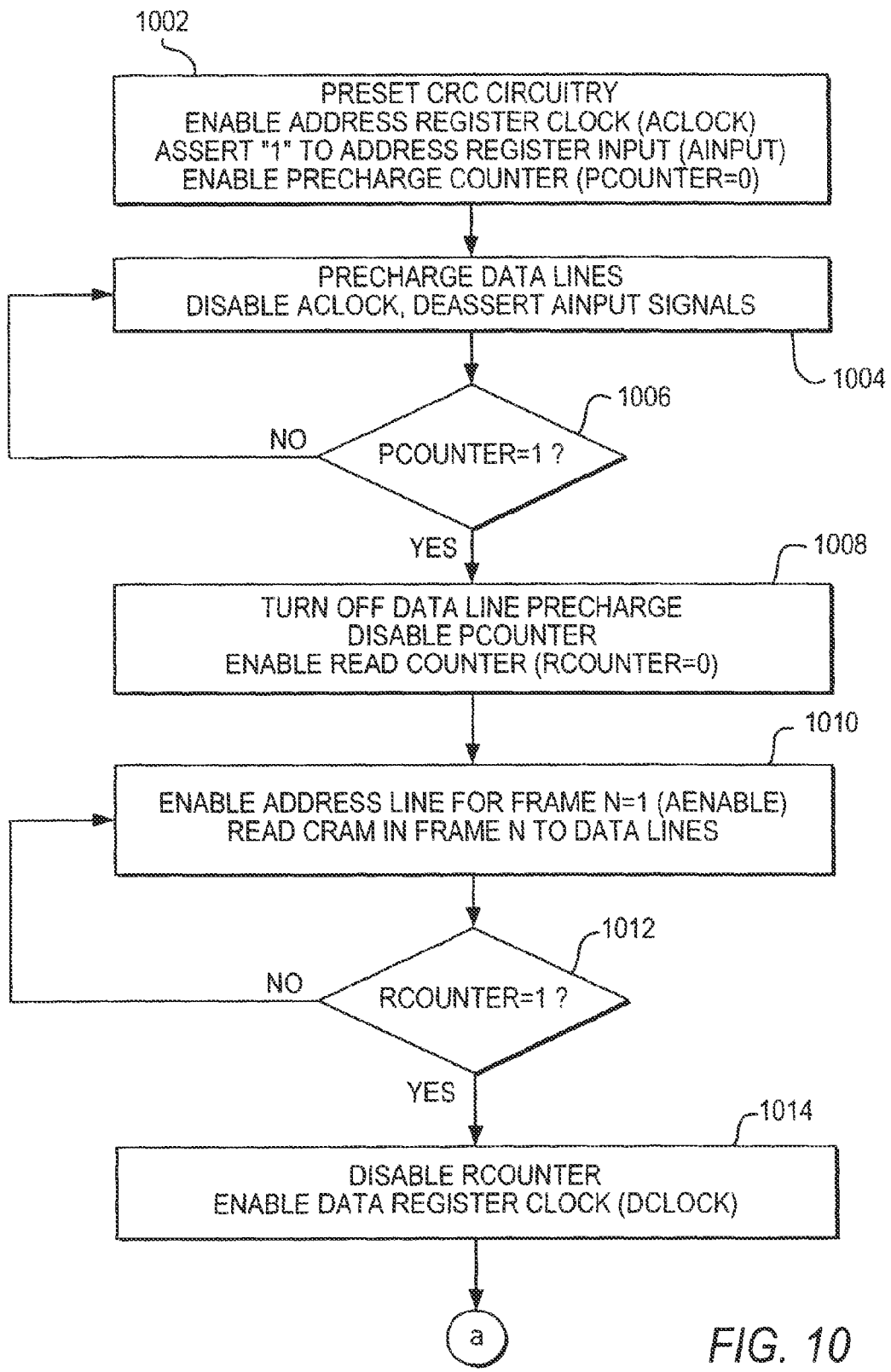

FIG. 10 illustrates a more detailed flow diagram of step 1000. At step 1002, CRC module 320 is preset. For example, counters are reset to zero and registers (e.g., registers 326, signature register 328, update register 330, and shift register 334) are cleared. Also at step 1002, an address register clock is enabled (e.g., ACLOCK signal 704 is pulsed), an address register input is asserted (e.g., AINPUT signal 702 is set to binary "1"), and a precharge counter is enabled (e.g., PCOUNTER is activated). The precharge counter indicates when data lines 718 have been fully precharged to some predetermined voltage (e.g., a source voltage).

Next, at step 1004, all data lines 618 are precharged. Also at step 1004, address register clock signal 704 is disabled and address register input signal 702 is deasserted. At step 1006, flow 1000 determines whether the precharge counter has been set to binary "1." The precharge counter is set to binary "1" when data lines 718 have been fully precharged (e.g., after 16 cycles). If the precharge counter remains at binary "0," flow 1000 returns to step 1004.

If the precharge counter is set to binary "1," flow 1000 moves to step 1008 where the data line precharge is turned off, the precharge counter is disabled, and a read counter is enabled (e.g., RCOUNTER is activated). The read counter indicates when data corresponding to a selected address have been fully read onto corresponding data lines 718 (e.g., after 16 cycles).

At step 1010, the address line for a first frame (e.g., a first column of data cells 716 corresponding to address line 1) is enabled (e.g., AENABLE signal 710 is set to binary "1") and the corresponding cell contents are read onto corresponding data lines 718. At step 1012, flow 1000 determines whether the read counter has been set to binary "1." If the read counter is still binary "0," flow 1000 returns to step 1010 where address enable signal 710 remains enabled and data continues to be read onto data lines 718. For example, for CRAM data cells as shown in FIG. 8, if a binary "0" is represented in a CRAM data cell 814 (e.g., at node A), the corresponding data line 824 remains precharged. If a binary "1" is represented in the CRAM data cell 814, the corresponding data line 824 is discharged. To ensure that the data line 824 is sufficiently discharged to zero volts, data is read onto data lines 824 over multiple cycles (e.g., for 16 cycles). If the read counter is set to binary "1," flow 1000 moves to step 1014 where the read counter is disabled and the data register clock is enabled (e.g., DCLOCK signal 724 is activated).

Referring back to FIG. 9, when the first frame is ready to be loaded into data register 722, flow 900 moves to step 1100 where all frames, except for the last frame, is loaded into data register 722.

Figure 11:
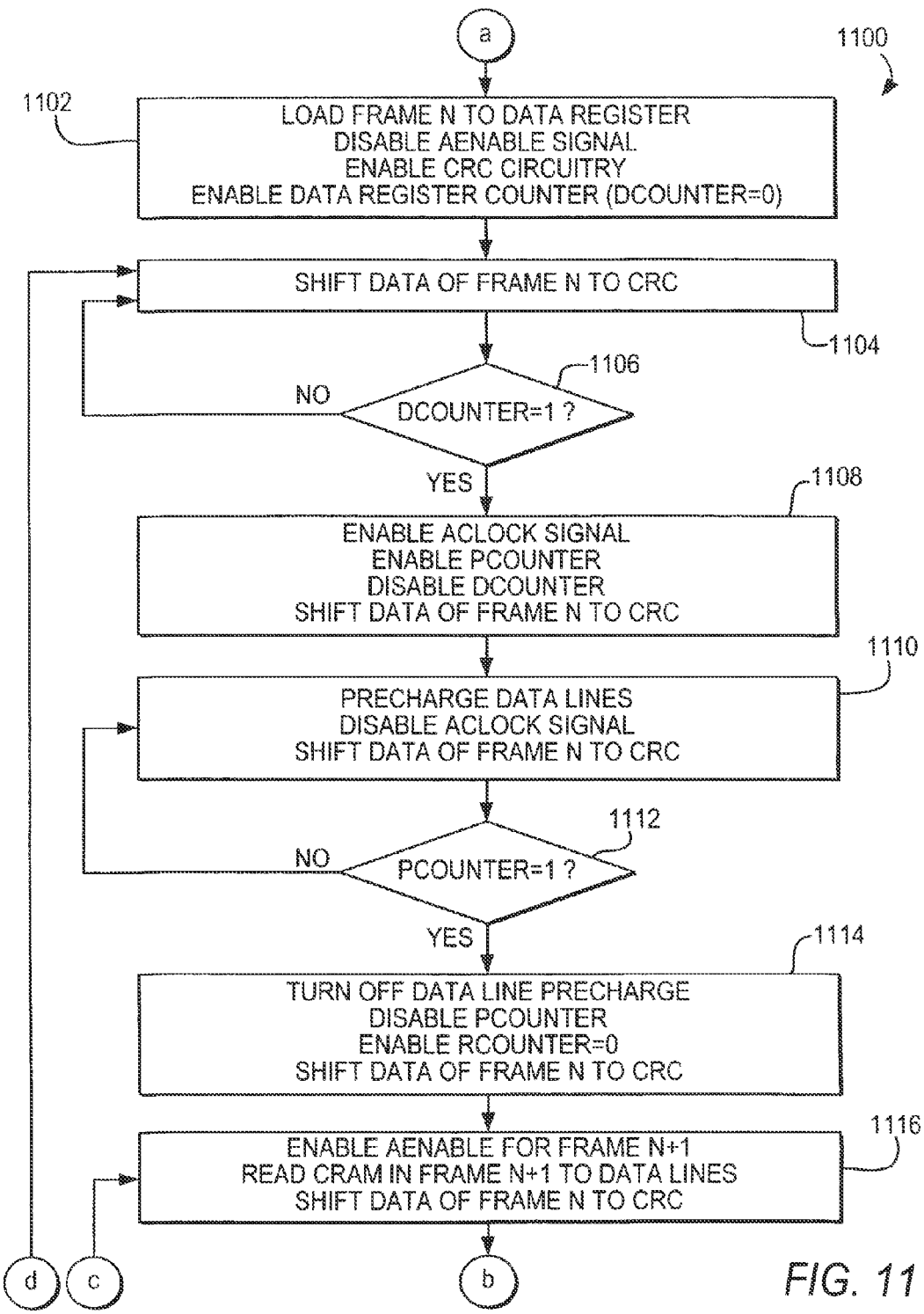
Figure 12:
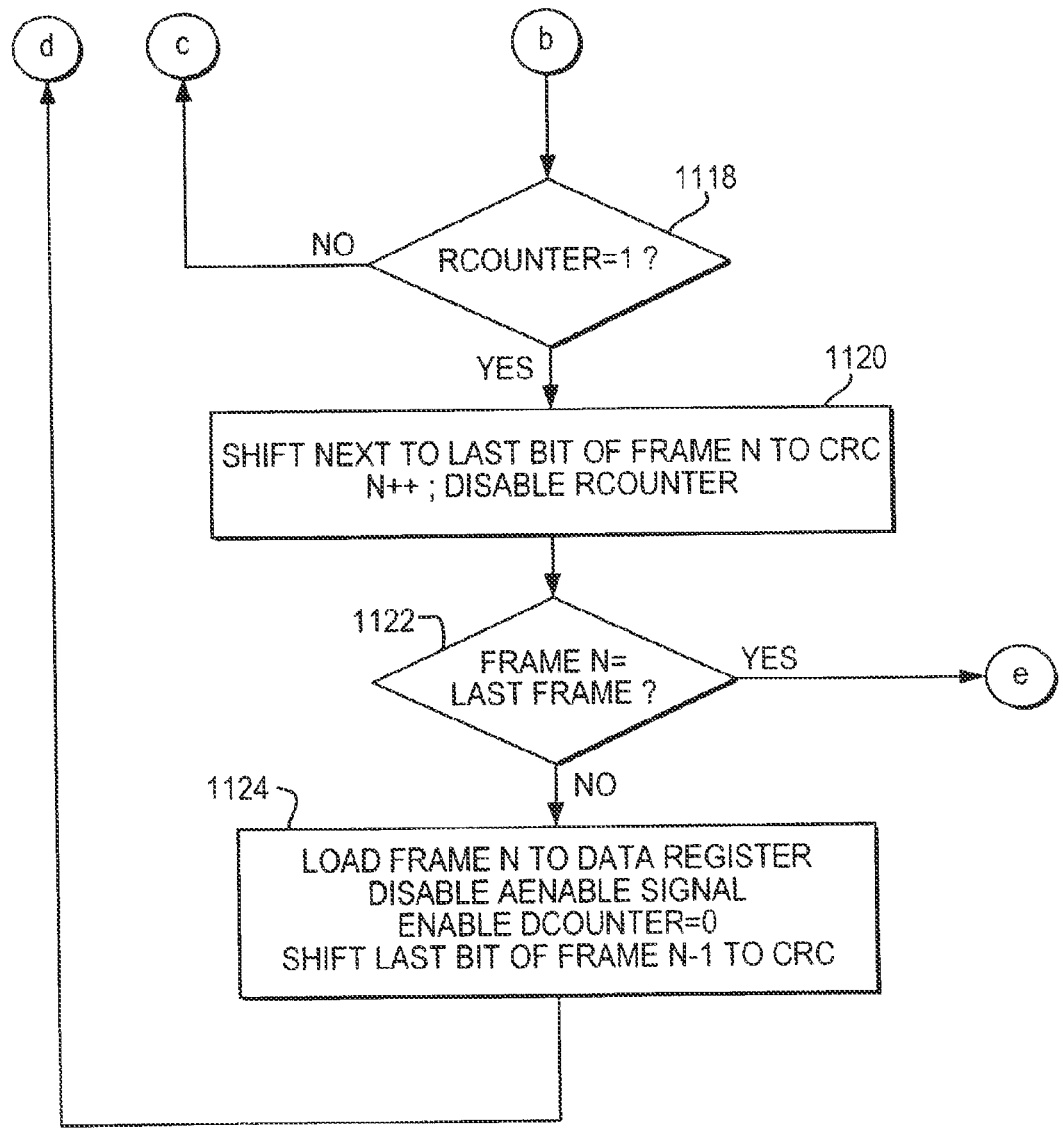

FIGS. 11-12 are flow diagrams illustrating in more detail the loading of the frames to CRC module 320 in step 1100. At step 1102, data from the first frame, which is currently on data lines 718, is loaded into data register 722. Also at step 1102, address enable signal 710 is disabled, CRC module 320 is enabled, and a data register counter is also enabled (e.g., DCOUNTER is activated). The data register counter indicates when a predetermined number of data bits in data register 722 has been loaded into CRC module 320 (e.g., when all but a remaining bits, for example, 34 bits, have been loaded). This predetermined number can be any suitable number and coordinates with the various signals that are enabled and asserted in order to load each frame to data register 722 and subsequently to CRC module 320.

At step 1104, data from the first frame, which is currently stored in data register 722, is loaded into CRC module 320 (e.g., sent to multiplexer 322 and then to XOR tree 324 to begin computing the checksum). A predetermined number of bits (e.g., 8 bits, 16 bits, or any other suitable number of bits) is sent from data register 722 to CRC module 320 in each clock cycle. Next, at step 1106, flow 1100 determines whether the data register counter is set to binary "1." If the data register counter is binary "0," flow 1100 returns to step 1104 where a next predetermined number of bits are loaded into CRC module 320.

If the data register counter is set to binary "1," flow 1100 moves to step 1108 where the data register counter is disabled, and address register clock signal 704 is enabled and the precharge counter is enabled (e.g., reset to binary "0" and activated) in preparation for loading a next frame. Address register clock signal 704 shifts the binary "1" that indexes a first address line 720 to index a next address line 720. Also at step 1108, a next predetermined number of bits from data register 722 is loaded into CRC module 320.

At step 1110, all the data lines 718 are precharged, address register clock signal 704 is disabled, and a next predetermined number of bits from data register 722 is loaded into CRC circuitry 320. At step 1112, flow 1100 determines whether the precharge counter is set to binary "1." If the precharge counter is binary "0," flow 1100 returns to step 1110. As data is loaded into CRC circuitry 320 over a predetermined number of cycles (e.g., 16 cycles), this next predetermined number of bits is loaded into CRC circuitry 320 during any one of or over a range of the predetermined number of cycles. The bits may be read in parallel over one cycle or in multiple cycles, in serial over the predetermined number of cycles, or in a combination of serial and parallel reads.

If the precharge counter is set to binary "1," flow 1100 moves to step 1114 where the data line precharge is turned off, the precharge counter is disabled, and the read counter is enabled (e.g., RCOUNTER is reset to binary "0" and activated). At step 1116, the address line for a next frame is enabled (e.g., AENABLE signal 710 is set to binary "1") and the contents of cells 716 in the next frame are read onto corresponding data lines 718. Also at step 1116, a next predetermined number of bits from data register 722 is loaded into CRC module 320. At step 1118, flow 1100 determines whether the read counter has been set to binary "1." If the read counter remains at binary "0," flow 1100 returns to step 1116. As data is read onto data lines 618 during a predetermined number of cycles (e.g., 16 cycles), this next predetermined number of bits may be read from data register 722 during any one of or over a range of the predetermined number of cycles.

If the read counter is set to binary "1," flow 1100 moves to step 1120 where the next to last bit of the current frame in data register 722 is loaded into CRC module 320, the frame counter is incremented (notated by N++ where N is the current frame loaded onto data lines 618), and the read counter is disabled. At step 1122, flow 1100 determines whether the frame is the last frame. If the frame is not the last frame, flow 1100 moves to step 1124 where the last bit of the frame currently in data register 722 (e.g., frame N−1) is shifted to CRC module 320, the next frame whose data is currently on data lines 718 is loaded into data register 722, address enable signal 710 is disabled, and the data register counter is enabled (e.g., DCOUNTER is reset to binary "0" and activated). Flow 1100 then returns to step 1104 where the frame currently in data register 722 is loaded into CRC module 320 while a subsequent frame is prepared to be loaded into data register 722.

Figure 9:
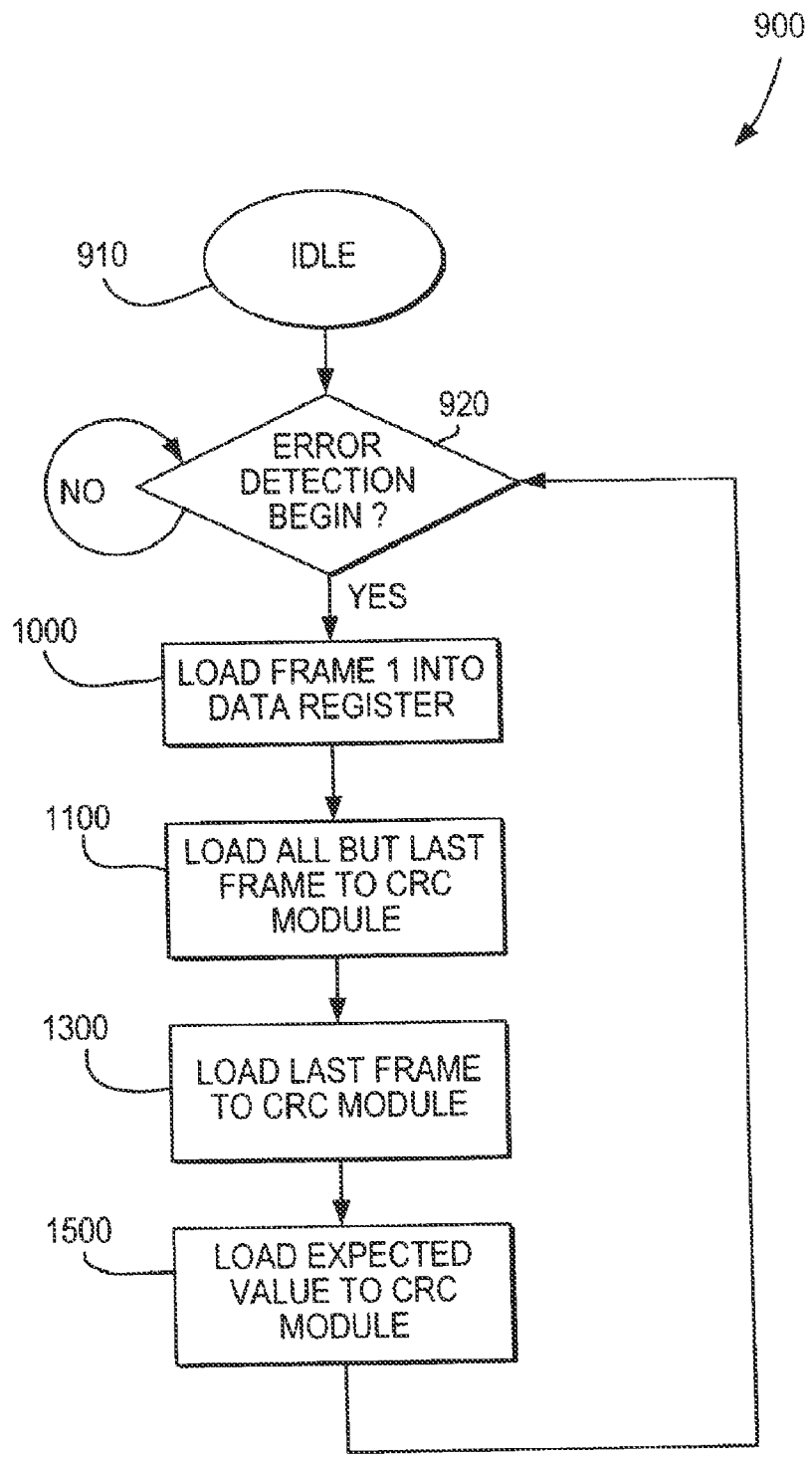
FIGS. 9-15 are flow diagrams of illustrative steps involved in loading programmable logic resource configuration data into error detection circuitry in accordance with one embodiment of the invention.
Figure 13:
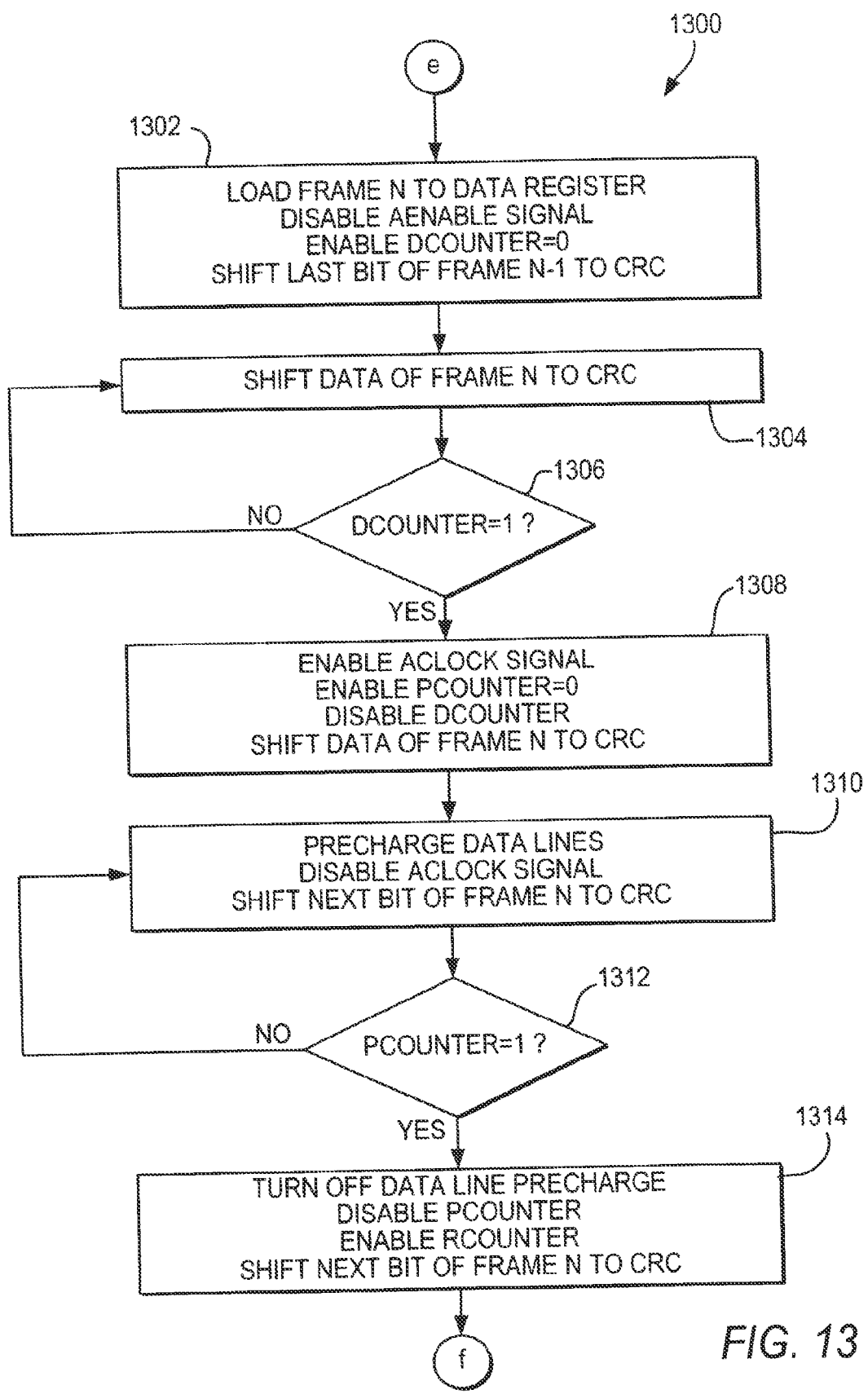
Figure 14:
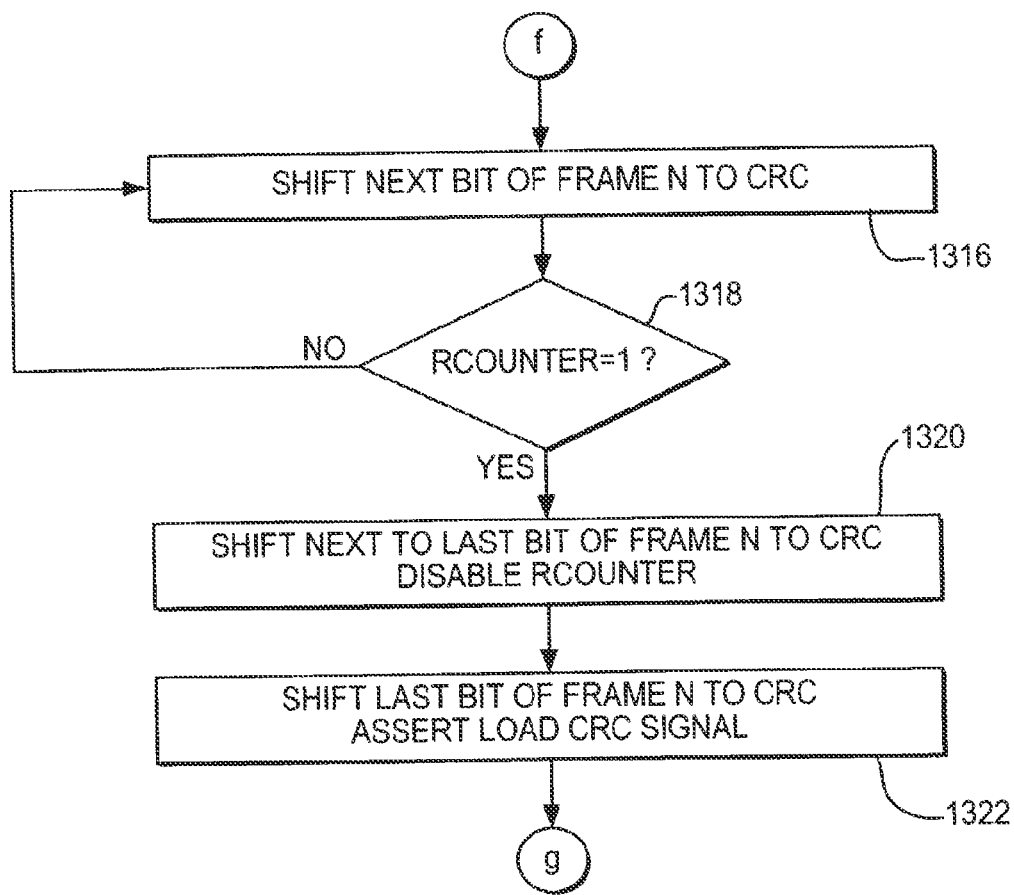

Referring to FIG. 9, if the frame is the last frame, flow 900 moves to step 1300 to load the last frame to CRC module 320. FIGS. 13-14 are flow diagrams illustrating in more detail the loading of the last frame in step 1300. At step 1302, the last bit from the frame currently in data register 722 (i.e., next to last frame), is loaded into CRC circuitry 320. Also at step 1302, data from the last frame is loaded from data lines 718 into data register 722, address enable signal 710 is disabled, and the data register counter is enabled.

Flow 1300 then moves to step 1304 where a predetermined number of data bits in the last frame is loaded into CRC circuitry 320. At step 1306, if the data register counter is binary "0," flow 1300 returns to step 1304. If the data register counter is set to binary "1," flow 1300 moves to step 1308 where the data register counter is disabled, address register clock signal 704 is enabled, the precharge counter is enabled, and a predetermined number of data bits in the last frame is loaded into CRC circuitry 320.

At step 1310, all data lines 718 are precharged, address register clock signal 704 is disabled, and the next bit of the last frame is loaded into CRC circuitry 320. Next, at step 1312, flow 1300 determines whether the precharge counter is set to binary "1." If the precharge counter remains at binary "0," flow 1300 returns to step 1310. If the precharge counter is set to binary "1," flow 1300 moves to step 1314 where the data line precharge is turned off, the precharge counter is disabled, the read counter is enabled, and the next bit of the last frame is loaded into CRC module 320. At step 1316, the next bit of the last frame is loaded into CRC module 320. Next, at step 1318, flow 1300 determines whether the read counter is set to binary "1." If the read counter remains at binary "0," flow 1300 returns to step 1116. If the read counter is set to binary "1," flow 1300 moves to step 1320 where the read counter is disabled and the next to last bit is loaded into CRC module 320. At step 1322, the last bit of the last frame is loaded into CRC module 320 and a load CRC signal is asserted.

Referring to FIG. 9, when all the frames of programmable logic resource configuration data 104 are loaded into CRC module 320, flow 900 moves to step 1500 where the expected value is loaded into CRC module 320.

Figure 15:
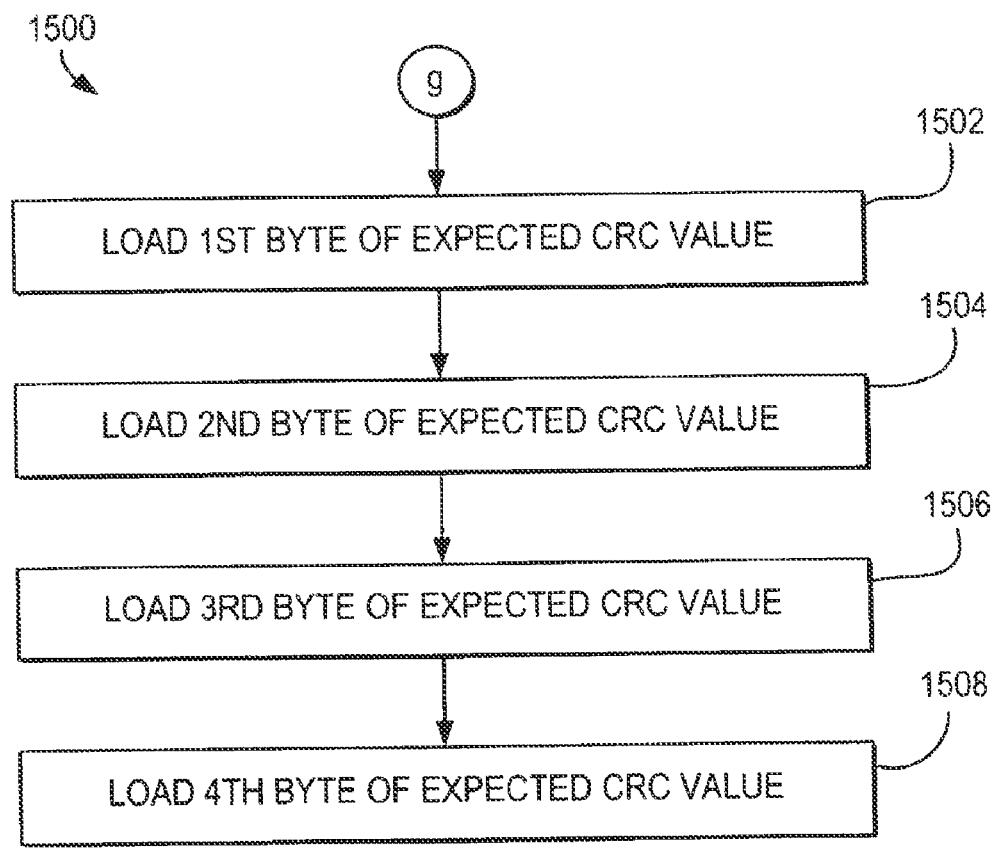

FIG. 15 is a flow diagram illustrating in more detail the loading of a thirty-two bit expected CRC value 102 into a CRC module 320 that accepts as input eight data bits each clock cycle. At step 1502, the first byte of the expected CRC value 102 is loaded into CRC module 320. The first byte refers to the most significant byte, from most significant bit to least significant bit. Multiplexer 322 is used to select expected value 102 to send to XOR tree 324 in order to compute the checksum. At step 1504, the next byte of expected CRC value 102 is loaded, at step 1506 the third byte of expected CRC value 102 is loaded, and at step 1508 the fourth byte of expected CRC value 102 is loaded.

FIGS. 9-15 are described, for merely illustrative purposes, in the context of a 32-bit generator polynomial with a CRC module 320 that accepts as input eight data bits from one of data register 722 or expected value 102 each clock cycle. It will be understood that any suitable number of bits may be used to represent the generator polynomial, and any suitable number of bits may be loaded into CRC module 320 at any cycle. Note, however, that depending on the these two features, the timing of the loading of data into data register 722 and the shifting of data from data register 722 to CRC module 320 may vary.

Referring back to FIG. 9, when expected CRC value 102 has been loaded into CRC module 320 at step 1500, process 900 returns to step 920.

Figure 16:
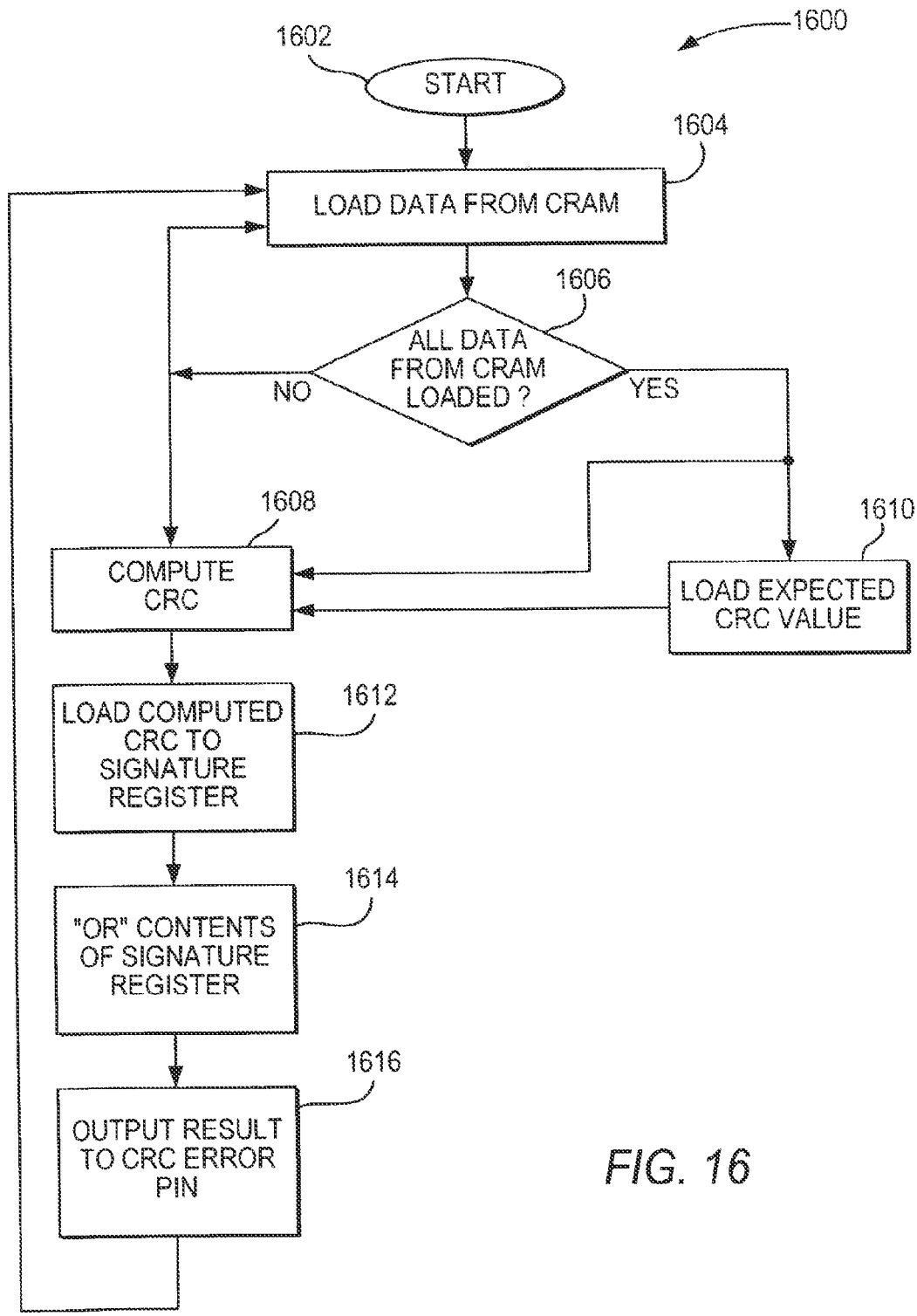
FIG. 16 is a flow diagram of illustrative steps involved in implementing error detection on a programmable logic resource in accordance with one embodiment of the invention.

FIG. 16 is flow diagram of illustrative steps involved in performing error detection on a programmable logic resource. Flow 1600 begins at step 1602 with a signal indicating the initiation of error detection on programmable logic resource configuration data 104. At step 1604, programmable logic resource configuration data 104 is loaded into CRC module 320 as described in connection with FIGS. 9-15. At step 1606, flow 1600 determines whether all the configuration data 104 has been loaded into CRC circuitry module 320. If all the configuration data 104 has not been loaded, flow 1600 returns to step 1604. Flow 1600 also moves to step 1608 where the checksum computation begins on the data. If all the configuration data 104 has been loaded, flow 1600 moves to steps 1608 and 1610. At step 1610, expected value 102 is loaded into CRC module 320 and then flow 1600 moves to step 1608. At step 1608, as the last part of configuration data 104 and expected value 102 are being loaded into CRC module 320, XOR tree 324 is continually computing the checksum. With each clock cycle, the results of the checksum calculation are loaded into signature register 328 at step 1612.

When the resulting checksum is loaded into signature register 328 at step 1612, flow 1600 then moves to step 1614 where a logical "OR" is performed on each bit in signature register 328. The result of the "OR" operation is output onto a CRC error pin at step 1616. Flow 1600 then returns to step 1618.

Figure 17:
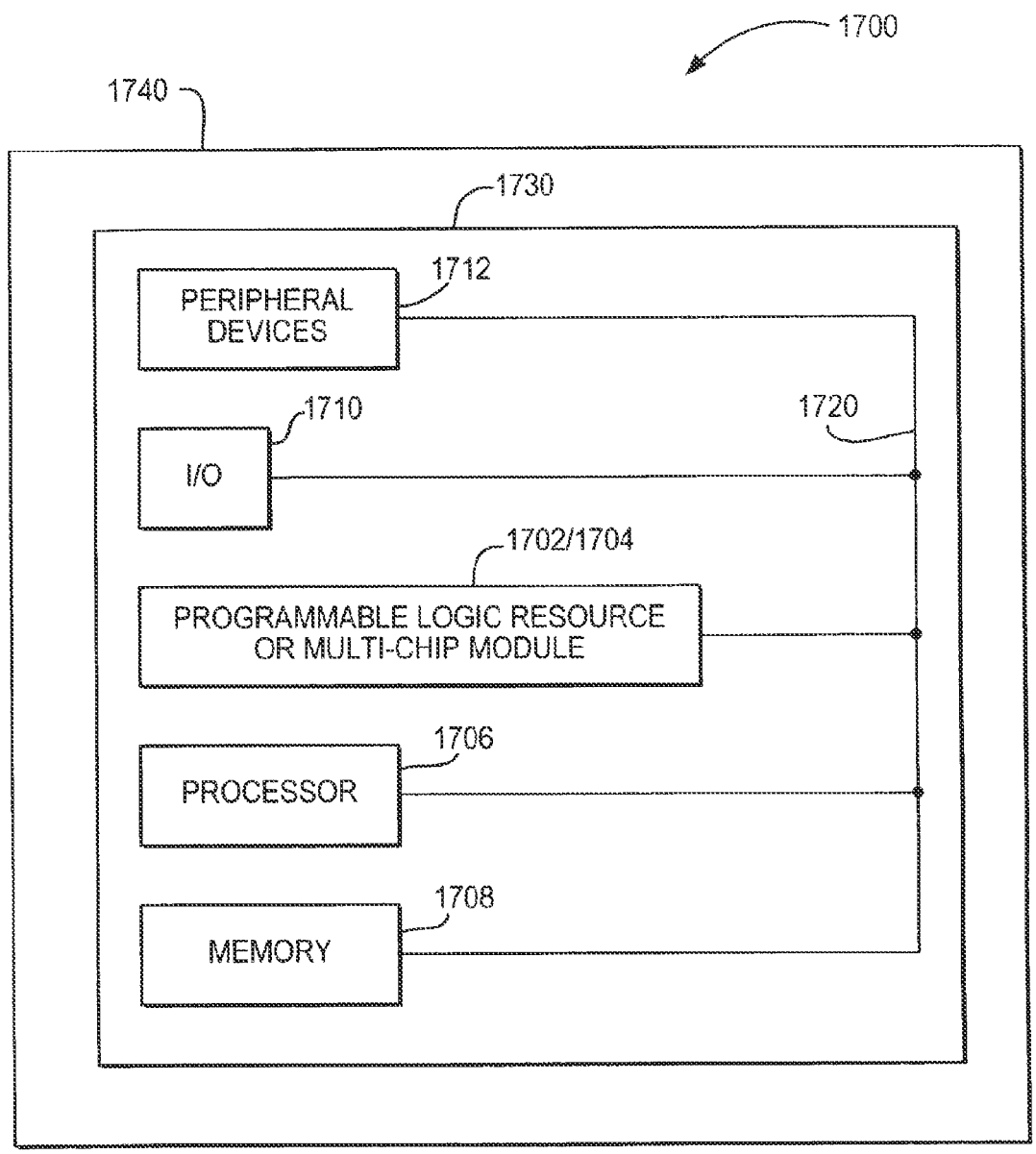
FIG. 17 is a simplified block diagram of an illustrative system employing circuitry in accordance with one embodiment of the invention.

FIG. 17 shows an illustrative programmable logic resource 1702 or multi-chip module 1704 which includes embodiments of this invention in a data processing system 1700. Data processing system 1700 may include one or more of the following components: a processor 1706; a memory 1708; I/O circuitry 1710; and peripheral devices 1712. These components are coupled together by a system bus or other interconnections 1720 and are populated on a circuit board 1730 which is part of an end-user system 1740.

System 1700 can be used in a wide variety of applications, such as computer networking, data networking, instrumentation, video processing, digital signal processing, or any other application where the advantage of using programmable or reprogrammable logic is desirable. Programmable logic resource or module 1702/1704 can be used to perform a variety of different logic functions. For example, programmable logic resource or module 1702/1704 can be configured as a processor or controller that works in cooperation with processor 1706. Programmable logic resource or module 1702/1704 may also be used as an arbiter for arbitrating access to a shared resource in system 1700. In yet another example, programmable logic resource or module 1702/1704 can be configured as an interface between processor 1706 and one of the other components in system 1700. It should be noted that system 1700 is only exemplary, and that the true scope and spirit of the invention should be indicated by the following claims.

Various technologies can be used to implement programmable logic resources 1702 or multi-chip modules 1704 having the features of this invention, as well as the various components of those devices (e.g., programmable logic connectors ("PLCs") and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be a product term logic, implementing functions such as AND, NAND, OR, or NOR. Examples of components suitable for implementing PLCs include any of the types of volatile or nonvolatile memory described above that can be used to store programmable logic resource configuration data, EPROMs, EEPROMs, pass transistors, transmission gates, antifuses, laser fuses, metal optional links, etc. PLCs and other circuit components may be controlled by various, programmable, function control elements ("FCEs"). For example, FCEs can be any of the types of volatile or nonvolatile memory described above that can be used to store the programmable logic resource configuration data. FCEs can also be first-in first-out ("FIFO") memories, EPROMS, EEPROMs, function control registers, ferro-electric memories, fuses, antifuses, or the like. From the various examples mentioned above it will be seen that this invention is applicable to both one-time-only programmable and reprogrammable resources.

Thus it is seen that error detection circuitry is provided on a programmable logic resource. One skilled in the art will appreciate that the invention can be practiced by other than the prescribed embodiments, which are presented for purposes of illustration and not of limitation, and the invention is limited only by the claims which follow.

What is claimed is:

1. A method for detecting errors in configuration data on a logic device, the method comprising:
    selecting, based on a control signal, configuration data stored on the logic device or an expected value as a selected value for receipt by check circuitry;
    computing, using the check circuitry, a signature by applying a mathematical function to the selected value received by the check circuitry; and
    analyzing, when the expected value is selected, the signature to determine whether the configuration data includes an error.

2. The method of claim 1, wherein the selecting comprises:
    receiving at a first input of selection circuitry the configuration data; and
    receiving at a second input of the selection circuitry the expected value;
    providing as an output of the selection circuitry the selected value corresponding to the first input or the second input.

3. The method of claim 1, wherein the mathematical function comprises a polynomial checksum computation implemented on the logic device as an XOR tree.

4. The method of claim 1 further comprising:
    receiving, using selection circuitry, the expected value and the signature; and
    selecting, using the selection circuitry, the expected value or the signature for output to shifting circuitry.

5. The method of claim 1, wherein:
    when the mathematical function is applied only to the configuration data, the signature is the expected value; and
    when the mathematical function is applied to the expected value after being applied to the configuration data, the signature is a zero value.

6. The method of claim 1 further comprising:
    storing the configuration data in a memory external to the logic device;

computing the expected value, using a device external to the logic device, by applying the mathematical function to the configuration data stored in the memory external to the logic device.

7. The method of claim 6, wherein the computed expected value is combined with the configuration data before the configuration data is programmed onto the logic device.

8. The method of claim 1, wherein the expected value is computed on the logic device from the configuration data while the configuration data is being programmed onto the logic device.

9. The method of claim 1, wherein:
the expected value is selected after the configuration data is selected and after the mathematical function is applied to every bit of the configuration data; and
the signature is analyzed after the mathematical function is applied to the expected value and the configuration data.

10. A system for detecting errors in configuration data on a logic device, the system comprising:
a memory on the logic device in which configuration data having a plurality of portions and an expected value are stored; and
control circuitry configured to:
for each of the plurality of portions of the configuration data:
retrieve the portion of the configuration data from the memory; and
process the portion with a mathematical function to update a signature value;
after the signature value is updated based on each portion of the plurality of portions of the configuration data, update the signature value by processing the stored expected value with the mathematical function; and
determine whether the configuration data includes an error based on the updated signature value.

11. The system of claim 10, wherein the portions of the configuration data are processed while the configuration data is being programmed onto the logic device.

12. The system of claim 10, wherein the mathematical function comprises a polynomial checksum computation implemented on the logic device as an XOR tree.

13. The system of claim 10, wherein:
when the mathematical function is applied only to the configuration data, the expected value is output; and
when the mathematical function is applied to the configuration data combined with the expected value, a zero value is output.

14. The system of claim 10, wherein the control circuitry is configured to determine that the configuration data includes an error when the signature value corresponds to a predetermined number.

15. The system of claim 10, wherein the signature value represents a type of error in the configuration data.

16. A non-transitory computer readable medium for detecting errors in configuration data on a logic device, the non-transitory computer readable medium comprising computer program code recorded thereon for:
selecting, based on a control signal, configuration data stored on the logic device or an expected value as a selected value for receipt by check circuitry;
computing, using the check circuitry, a signature by applying a mathematical function to the selected value received by the check circuitry; and
analyzing, when the expected value is selected, the signature to determine whether the configuration data includes an error.

17. The non-transitory computer readable medium of claim 16, wherein the mathematical function comprises a polynomial checksum computation implemented on the logic device as an XOR tree.

18. The non-transitory computer readable medium of claim 17, further comprising machine program logic for:
receiving, using selection circuitry, the expected value and the computed signature; and
selecting, using the selection circuitry, the expected value or the computed signature for output to shifting circuitry.

19. The non-transitory computer readable medium of claim 16, wherein:
when the mathematical function is applied only to the configuration data, the signature is the expected value; and
when the mathematical function is applied to the expected value after being applied to the configuration data, the signature is a zero value.

20. The non-transitory computer readable medium of claim 16, wherein the expected value is computed on the logic device from the configuration data while the configuration data is being programmed onto the logic device.

* * * * *